United States Patent [19]
Suizu

[11] Patent Number: 5,552,838
[45] Date of Patent: Sep. 3, 1996

[54] APPARATUS FOR TUNING OFFSET SIGNALS BY CONTROLLING A TUNER BASED ON A DIFFERENCE IN FREQUENCY OF SIGNALS TUNED BY THAT TUNER

[75] Inventor: Katsuto Suizu, Saitama-ken, Japan

[73] Assignee: Kabushiki Kaisha Toshiba, Kawasaki, Japan

[21] Appl. No.: 361,510

[22] Filed: Dec. 22, 1994

[30] Foreign Application Priority Data

Dec. 24, 1993 [JP] Japan .................................. 5-328916
Aug. 10, 1994 [JP] Japan .................................. 6-188383

[51] Int. Cl.⁶ .................................................. H04N 5/50
[52] U.S. Cl. .................... 348/735; 348/732; 455/182.1; 455/183.2; 455/184.1; 455/263
[58] Field of Search .................................. 348/731, 732, 348/733, 735; 455/180.3, 258, 263, 264, 265, 196.1, 197.1, 182.1, 183.2, 184.1, 192.1; H04N 5/50

[56] References Cited

U.S. PATENT DOCUMENTS

| | | | |
|---|---|---|---|
| 4,422,096 | 12/1983 | Henderson | 358/191.1 |
| 4,817,195 | 3/1989 | Kubo et al. | 348/735 |
| 5,003,397 | 3/1991 | Wink | 348/735 |
| 5,163,164 | 11/1992 | Tults | 455/192.1 |
| 5,212,554 | 5/1993 | Tults | 348/732 |

*Primary Examiner*—Safet Metjahic
*Assistant Examiner*—Jeffrey S. Murrell
*Attorney, Agent, or Firm*—Cushman, Darby & Cushman

[57] ABSTRACT

A frequency counter obtains frequency data by measuring the frequency of an optionally offset broadcast signal tuned by a tuner having a VCO. A microprocessor is used to determine the frequency difference between the optionally offset signal and the previously tuned signal based on the frequency data measured for each signal, and controls the oscillation frequency of the VCO for the tuner based on this frequency difference using a PLL circuit. The frequency is quickly changed to tune in the optionally offset broadcast signal.

7 Claims, 11 Drawing Sheets

APPARATUS FOR TUNING OFFSET SIGNALS BY CONTROLLING A TUNER BASED ON A DIFFERENCE IN FREQUENCY OF SIGNALS TUNED BY THAT TUNER

BACKGROUND OF THE INVENTION

1. Field of the Invention

This invention relates to channel selecting apparatus to be used for such electronic instruments as color television receivers, and, more particularly, to a channel selecting apparatus for quickly tuning broadcast signals that are not transmitted at the regular frequency.

2. Description of the Related Arts

Generally, a channel selecting apparatus in within in electronic instrument such as a color television receiver, an electronic tuner using a variable capacitance diode is used to select the broadcasting station.

The channel selecting apparatus formed using such electronic tuner is, for example, of a voltage synthesizer system or a PLL (abbreviation of a Phase Lock Loop) synthesizer system.

In the channel selecting apparatus of the PLL synthesizer system, generally, the local oscillated frequency is divided by a prescaler, the output of the prescaler is further divided by the divided frequency data from the CPU and is compared with the reference frequency in phase to generate error output voltage. The electronic tuner is driven by the error output voltage to select a channel and there is a large advantage that no presetting is required, as compared with the channel selecting apparatus of the voltage synthesizer system.

The conventional channel selecting apparatus using such a PLL synthesizer is shown in FIG. 12.

FIG. 12 is a block diagram showing an example of the conventional channel selecting apparatus.

As shown in FIG. 12, the television signal received by an antenna 1 is fed to an RF amplifier, is amplified by the RF amplifier 2 and is output to a mixer 4. The mixer 4 mixes the oscillated frequency output by a separately provided oscillated frequency variable oscillator (called a Voltage Controlled Oscillator abbreviated as a VCO hereinafter) 3. Mixer 4 produces a beat signal as of a frequency equal to the difference between the original two frequencies and feeds that beat signal to an IF amplifier 5. The beat signal is amplified in the IF amplifier 5 and is output to an IF circuit 8.

That is to say, the received television signal is amplified by the RF amplifier 2, is then heterodyned in the mixer 4 with a signal from the VCO 3, and is output. A tuner 6 of a so called superheterodyne system is formed of the RF amplifier 2, VCO 3, mixer 4 and IF amplifier 5.

The role of the tuner 6 is, in short, to select a specific signal from the group of many electric waves output from the antenna 1, to control the oscillated frequency of the VCO 3 to output the specific signal as an IF signal 7, and to adjust the frequency of the beat signal obtained in the mixer 4.

For example, suppose that fIF represents an intermediate frequency, fVCO represents an oscillated frequency and fRF represents an input signal frequency, the relations of the frequencies of the input signal and output signal in this step will be as follows:

$$fIF = fVCO - fRF \tag{1}$$

The output of the tuner 6 is led to the IF circuit 8 to be processed. The out is amplified by the IF amplifier 9 forming the IF circuit 8, is then demodulated as a base band video signal by a video signal detector 10 and is output from an output terminal 30 to a video amplifying step (not illustrated).

Here, an AFT signal detector 11 connected to the output terminal of the IF amplifier 9 outputs a signal (AFT signal) for judging the frequency of the IF signal input into the IF circuit 8, though no circuit form is described, as compared with the regular frequency. That is to say, the AFT signal detector 22 judges whether the frequency is higher or lower than the regular frequency. Therefore, in the receiver, when this AFT signal is detected by an AFT signal detecting circuit 22, the state of the present received signal frequency will be able to be recognized. This AFT signal is fed to a microprocessor 21.

On the other hand, a prescaler 12 forming a part of the PLL circuit is connected to the VC0 of the tuner 6. The PLL circuit 20 is provided to determine the oscillated frequency of the VCO 3. It operates so that the signal of the VCO 3 may be detected and divided in frequency by the prescaler 12. The signal divided in the frequency by a variable frequency divider 13 and the signal which the output from a high precision fixed oscillator 14 is divided by a fixed frequency, divider 15 in the frequency are compared in the phase with each other, and the result of the phase comparison is used to obtain a controlling voltage 17 of the VCO 3 using a loop filter 18. Thus, the oscillated frequency of the VCO 3 can be varied.

A data latch 19 is to take in the divided frequency ratio of the variable frequency divider 13 from a microprocessor 21.

Thus, a PLL circuit 20 is formed as one circuit block of the prescaler 12, variable frequency divider 13, fixed oscillator 14, fixed frequency divider 15, phase comparator 16, controlling voltage 17, loop filter 18 and data latch 19. The oscillated frequency of the VCO 3 is controlled by using this PLL circuit 20.

Here, for example, in case the divided frequency ratio of the prescaler 12 is ⅛, the divided frequency ratio of the variable frequency divider 13 is N, the output frequency of the fixed frequency divider 15 is 7.8125 KHz, when the PLL circuit 20 is locked, the oscillated frequency (fVCO) of the VCO 3 will be represented by:

$$fVCO = N \times 7.8125 \times 8 = N \times 62.5 \; (KHz) \tag{2}$$

The operation when a desired channel is received in the circuit described above shall be explained in the following. Here, the television broadcast channels in Japan shall be explained for example.

First of all, when a broadcast is received by selecting the channel with the microprocessor 21 as a desired channel (for example, the channel 1 from among the plurality of broadcast channels, as the receiving frequency (fRF) of this channel 1 is 91.25 MHz), and the broadcast is tuned with this receiving frequency, as the intermediate frequency (fIF) is 58.75 MHz, by the formula (1), $$fVCO = fIF + fRF = 150 \; (MHz)$$

and therefore from the formula (2), $$N = 150000 / 62.5 = 2400 \tag{3}$$

That is to say, if these divided frequency data N are operated on using the microprocessor 21, are fed to a data latch 19, and are set, the oscillated frequency of the VCO 3 will be varied. That is, the frequency of VCO 3 will be able to be tuned to the receiving frequency (fRF) of the channel 1.

Therefore, in the channel selecting apparatus of such circuit formation, when the broadcast signal is not, for example, of the regular fRE frequency but is optionally offset, when the broadcast frequency fSIG of this optionally offset signal 91.5 MHz and mentioned above, from the now tuned channel 1 broadcast the broadcast frequency of 91.5 MHz of the fSIG is tuned, the broadcast will be received on the basis of the data (N=2400) of the formula (3), the output of the AFT signal detector 11 will be led to the microprocessor 21 through the detecting circuit 22. The output will then be detected to see whether it is higher or lower as compared with the present frequency. That is, the frequency regulated by the frequency (91.25 MHz) of the channel 1 will be determined to be the frequency naturally lower then the present broadcast frequency fSIG being received, the divided frequency data (N) will be increased, the frequency will be received again, and the frequency will be received repeatedly several times to achieve the desired frequency. That is, the broadcast frequency fSIG will be received.

The following pertains to a situation where the broadcast signal is to be changed to the broadcast frequency of the channel 2, for example, from the broadcast frequency of the channel 1. When the broadcast signal of channel 2 is not a predetermined fixed frequency (f0) but is optionally offset, for example, when the broadcast frequency of this optionally offset signal is fSIG and both signal frequencies are, $f0$=97.25 MHz and $fSIG$=97.5 MHz.

Here, the receiver will not recognize the signal frequency= fSIG. Therefore, the frequency dividing ratio will be changed to receive the regular frequency=f0 of the channel 2 which will be set in the data latch. When the locked frequency of the PLL circuit 20 varies and the tuner 6 tunes a signal with the regular frequency f0 based on the variations, the present signal frequency is tuned with the low frequency and output from the AFT signal detector 11. This recognizing signal is detected by the microprocessor 21, the frequency dividing ratio is gradually increased at any time intervals, the locked frequency of the PLL circuit 20 is varied, then a signal reporting that the tuner 6 tunes with the broadcast signal in the normal state is output from the output of the AFT signal detector 11. This signal is detected by the microprocessor 21 and the variation of the frequency dividing ratio is stopped so that the offset broadcast frequency (fSIG) may be normally received.

However, in such conventional channel selecting apparatus, there are problems. For example, when the regular frequency f0 is made, the broadcast frequency of the channel 2 from the broadcast frequency of the channel 1 and the broadcast frequency fSIG desired to receive greatly vary from this broadcast frequency of f0, as shown, for example, in FIG. 13. The time for receiving the regular frequency f0 of the channel 2 from the state that the broadcast frequency of the channel 1 is being received will be t0-t1 and, in order to receive the desired frequency of fSIG from the frequency f0 of this channel 2, several correcting times are required as illustrated, such long time as the time t1-t3 will be required. Regarding the channel selecting apparatus using such system, these problems are not solved.

As in the above, in the conventional channel selecting apparatus, when the offset of the broadcast signal frequency to be received is larger than of the normal regular frequency, the number of times of correcting the frequency dividing ratio of the variable frequency divider adjusting the oscillated frequency of the VCO will increase and the tuning period must be increased to obtain a normal tuning.

SUMMARY OF THE INVENTION

An object of the present invention is to provide a channel selecting apparatus wherein, even when the offset of the broadcast signal frequency to be received is larger than the normal regular frequency, the frequency will be able to be corrected within the minimum time, and a normal tuning will be be able to be obtained.

Another object of the present invention is to provide a channel selecting apparatus wherein, even in case the broadcast signal frequency to be received is offset to be lower than the normal regular frequency, the range of the received frequency to be corrected will be secured and the video signal and sound signal will be able to be tuned by positively judging their distinction without using a tuning signal.

The channel selecting apparatus according to the first invention is characterized by comprising a heterodyne receiver wherein a beat component is obtained by mixing both signals of a broadcast signal to receive a broadcast and a signal of an oscillating circuit having a predetermined frequency difference and is output as a heterodyne signal; a demodulating circuit means whereby the output signal from the heterodyne receiver is demodulated and is output as a base band signal; a measuring circuit means connected to the output terminal of the heterodyne receiver, whereby the frequency of the heterodyne signal is measured and is output as frequency measured data; a PLL circuit connected to the oscillating circuit of the heterodyne receiver, wherein the frequency difference between the oscillated signal of this oscillating circuit and the signal of the desired set frequency is detected and a controlling voltage is produced on the basis of this detecting result and is fed to vary the oscillated frequency of the oscillating circuit; and a microprocessor wherein the frequency measured data measured in the frequency by the measuring circuit means are input and the PLL circuit is controlled to vary the oscillated frequency of the oscillating circuit on the basis of these frequency measured data.

According to the first invention, from the frequency of the signal tuned by the heterodyne receiver, by using the measuring circuit means, the frequency of the signal can be positively measured. In case an optionally offset broadcast signal is received, this broadcast signal will be measured in the frequency by using the the measuring circuit means, on the basis of these measured frequency measured data, by using the microprocessor and PLL circuit, the optionally offset frequency and the regular frequency or the frequency of the last tuned signal will be compared with each other, a frequency difference will be able to be obtained, the oscillated frequency by the oscillating circuit of the heterodyne receiver will be able to be controlled to correspond to this frequency difference and therefore the correction will be able to be made at once to tune with any frequency signal.

The channel selecting apparatus according to the second invention is characterized by comprising a heterodyne receiver wherein a beat component is obtained by mixing both signals of a broadcast signal to receive a broadcast and a signal of a first oscillating circuit having a predetermined frequency difference and is output as a heterodyne signal; a demodulating circuit means whereby the output signal from the heterodyne receiver is demodulated and is output as a base band signal; a first PLL circuit connected to the first oscillating circuit of the heterodyne receiver, wherein the frequency difference between the oscillated signal of this oscillating circuit and the signal of the desired set frequency is detected and a controlling voltage is produced on the basis of this detected result and is fed to optionally vary the oscillated frequency of the first oscillating circuit; a second PLL circuit connected to the output terminal of the heterodyne receiver, provided with a second oscillating circuit and varying and outputting the oscillated frequency of the second oscillating circuit so that the frequency of the heterodyne signal from the output terminal of the heterodyne receiver and the oscillated frequency by the second oscillating circuit may be signal frequencies of the same phase; a measuring circuit means connected to the second PLL circuit and measuring the frequency of the output signal of this second PLL circuit; and a microprocessor wherein the frequency measured data measured in the frequency by the measuring circuit means are input and the first PLL circuit is controlled to vary the oscillated frequency of the first oscillating circuit on the basis of these frequency measured data.

According to the second invention, from the frequency of the signal tuned by the heterodyne receiver, by using the measuring circuit means, the frequency of the signal can be positively measured. In order to measure the frequency, the output signal of the heterodyne receiver is led to the second PLL circuit and the output frequency of this second PLL circuit is measured by the measuring circuit means. Therefore, even in case the output signal frequency of the heterodyne receiver is any optional frequency, the output signal frequency of this heterodyne receiver will be able to be positively fed to the measuring means and, by using this measuring circuit means, the frequency will be able to be very accurately counted and the frequency count data of the broadcast signal will be able to be fed to the microprocessor. Further, even when a minute input signal, that is, a feeble electric field is input or in case a highly modulated signal is input, the output frequency of the oscillating circuit of the second PLL circuit will be measured and therefore the frequency will be able to be stably measured. On the basis of these frequency count data, by using the microprocessor, the oscillated frequency of the first oscillating circuit of the first PLL circuit can be controlled and therefore the broadcast signal can be well tuned.

The channel selecting apparatus according to the third invention is characterized by comprising a heterodyne receiver wherein a beat component is obtained by mixing both signals of a broadcast signal to receive a broadcast and a signal of a first oscillating circuit having a predetermined frequency difference and is output as a heterodyne signal; a demodulating circuit means whereby the output signal from the heterodyne receiver is demodulated and is output as a base band signal; a first PLL circuit connected to the first oscillating circuit of the heterodyne receiver, wherein the frequency difference between the oscillated signal of this oscillating circuit and the signal of the desired set frequency is detected and a controlling voltage is produced on the basis of this detected result and is fed to optionally vary the oscillated frequency of the first oscillating circuit; a second PLL circuit connected to the output terminal of the heterodyne receiver, provided with a second oscillating circuit and varying and outputting the oscillated frequency of the second oscillating circuit so that the frequency of the heterodyne signal from the output terminal of the heterodyne receiver and the oscillated frequency by the second oscillating circuit may be signal frequencies of the same phase; a measuring circuit means connected to the second PLL circuit, measuring the frequency of the output signal of this second PLL circuit and outputting this frequency as frequency measured data; and a microprocessor wherein the frequency measured data from the measuring circuit means are input, a frequency for receiving any optional broadcast signal is set, the first PLL circuit is controlled to vary the oscillated frequency of the oscillating circuit on the basis of this set frequency, the optional broadcast is received, further the frequency difference between the frequency measured data from the measuring circuit means when the broadcast signal is received and the regular frequency is detected and, on the basis of this detected result, the first PLL circuit is controlled and corrected to vary the oscillated frequency of the first oscillating circuit.

According to the third invention, by using the measuring means measuring the frequency of the signal tuned by the heterodyne receiver, the frequency of the signal can be definitely measured. These measured frequency measured data are fed to the microprocessor. On the basis of these frequency measured data, the microprocessor controls the first PLL circuit to vary the oscillated frequency of the first oscillating circuit of the heterodyne receiver and receive the broadcast signal. In case, for example, a signal frequency offset to be higher or lower than the regular frequency is to be received, the microprocessor will control the first PLL circuit to receive no specific frequency but a frequency set optionally in advance. Therefore, by the control by the microprocessor, the optionally set frequency will be received and therefore the heterodyne receiver will be able to output an IF signal. Then, the now tuned optionally set frequency will be measured by the measuring circuit. The frequency difference between these frequency measured data and the regular frequency will be detected by the microprocessor. On the basis of this detected result, the first PLL circuit will be controlled to correct the frequency. Therefore, the channel selecting apparatus can positively tune the offset signal.

The channel selecting apparatus according to the fourth invention is characterized by comprising a heterodyne receiver wherein a beat component is obtained by mixing both signals of a broadcast signal to receive a broadcast and a signal of a first oscillating circuit having a predetermined frequency difference and is output as a heterodyne signal; a demodulating circuit means whereby the output signal from the heterodyne receiver is demodulated and is output as a base band signal; a first PLL circuit connected to the first oscillating circuit of the heterodyne receiver, wherein the frequency difference between the oscillated signal of this first oscillating circuit and the signal of the desired set frequency is detected and a controlling voltage is produced on the basis of this detected result and is fed to optionally vary the oscillated frequency of the first oscillating circuit; a second PLL circuit connected to the output terminal of the heterodyne receiver, provided with a second oscillating circuit and varying and outputting the oscillated frequency of the second oscillating circuit so that the frequency of the heterodyne signal from the output terminal of the heterodyne receiver and the oscillated frequency by the second oscillating circuit may be signal frequencies of the same phase; a measuring circuit means connected to the second PLL circuit, measuring the frequency of the output signal of this second PLL circuit and outputting this frequency as frequency measured data; and a microprocessor wherein a first judging means whereby the frequency measured data from the measuring circuit means are input and whether there is a signal carrier or not is judged from the frequency measured data when any optional broadcast signal is received and a second judging means whereby, on the basis of the frequency relations predetermined from the signal carrier, whether there is a signal carrier or not is judged from the frequency measured data when another broadcast signal is received are provided and, on the basis of the judged results of the first and second judging means, a specific broadcast signal is received by controlling the first PLL circuit to vary the oscillated frequency of the first oscillating circuit.

According to the fourth invention, whether there is a signal carrier or not in the tuned broadcast signal corrected in the frequency is detected by the first judging means provided in the microprocessor. Further, when the signal carrier is confirmed, whether there is a signal carrier or not in another broadcast signal when received will be detected on the basis of the predetermined frequency relations. Then, if it is judged by the second judging means that there is a signal carrier, the frequency of the broadcast signal will be judged to be a video signal by the microprocessor and the frequency will be measured by controlling the first PLL circuit to be tuned with the frequency of this signal. For example, in case a signal offset to be higher or lower than the regular frequency is to be received, the frequency will be corrected and tuned by the microprocessor by controlling the first PLL circuit to receive an offset signal frequency. At the same time, when whether there is a signal carrier or not is detected by using the first judging means, if it is judged that there is a signal carrier, it will be controlled to receive a frequency higher by 4.5 MHz or lower by 4.5 MHz than this signal frequency. Further, whether there is a signal carrier of this tuned frequency or not is judged by the second judging means. On the basis of this judged result, the first PLL circuit is controlled by the microprocessor to receive the offset signal of the video signal. Therefore, the offset signal of the video signal can be positively tuned by the channel selecting apparatus.

DETAILED DESCRIPTION OF THE PREFERRED EMBODIMENTS

The embodiments shall be explained with reference to the drawings.

Figure 1:
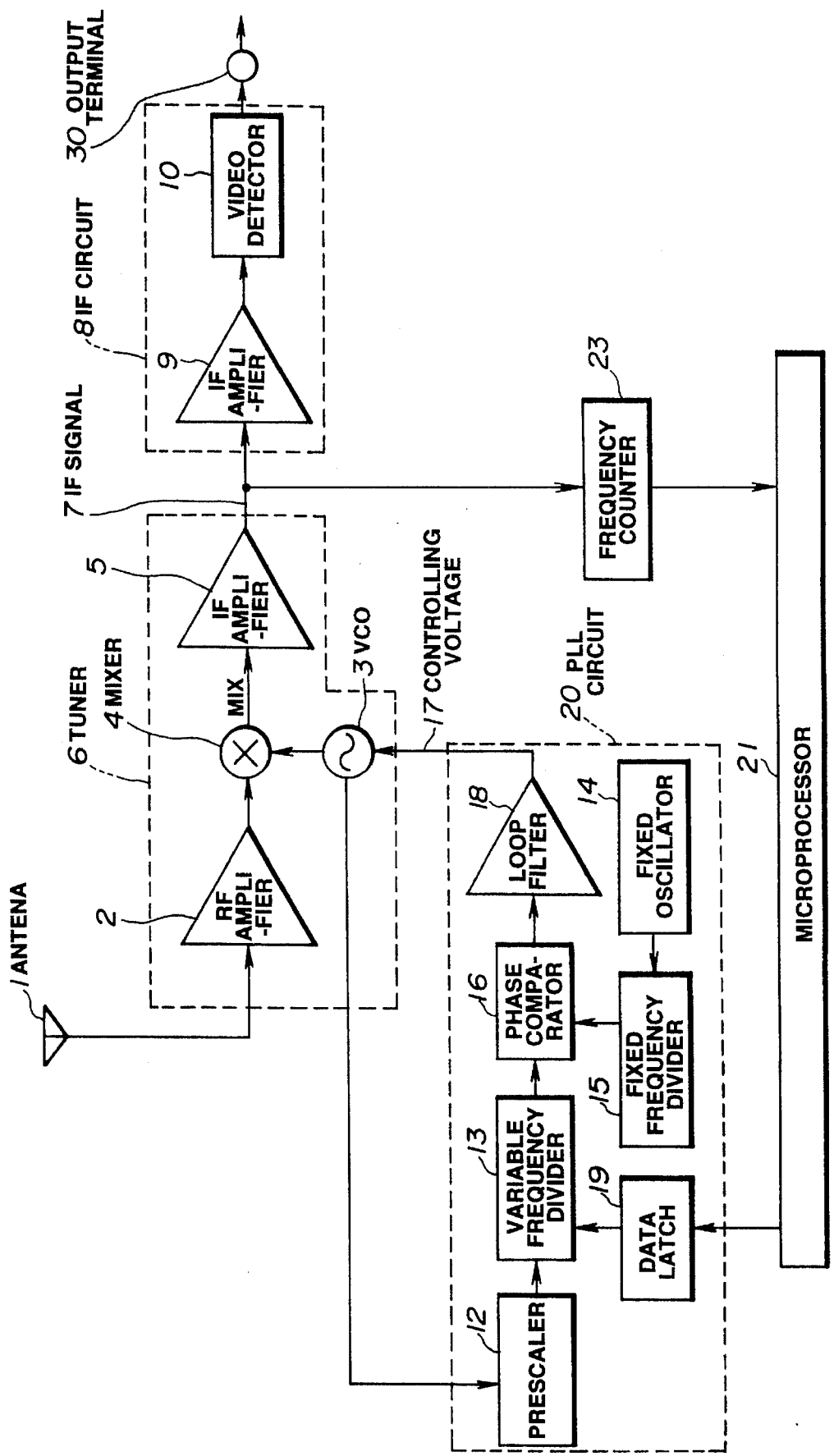
FIG. 1 is a block diagram showing the first embodiment of a channel selecting apparatus according to the present invention.
Figure 12:
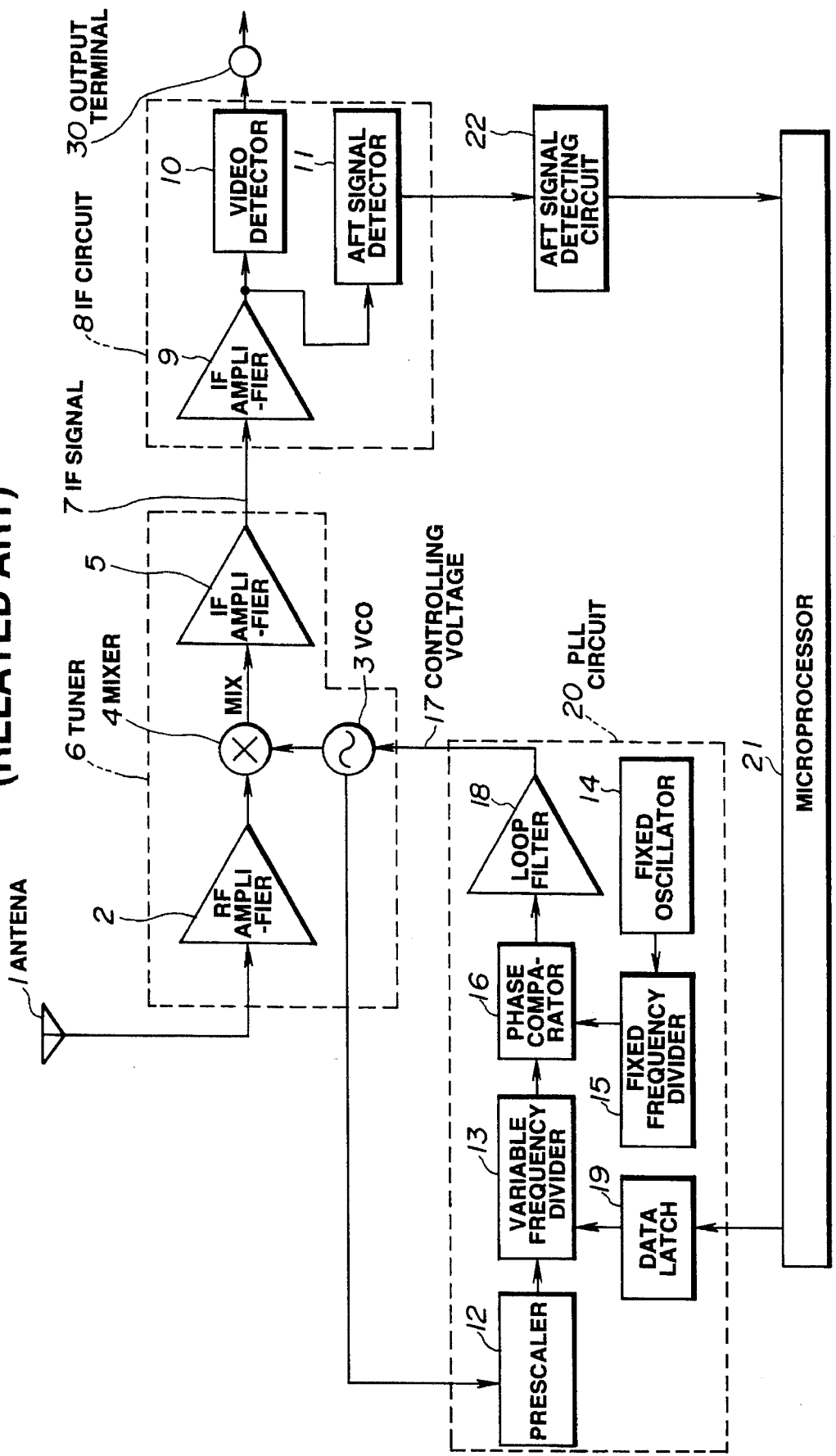
FIG. 12 is a block diagram showing a conventional channel selecting apparatus.

FIG. 1 is a block diagram showing the first embodiment of a channel selecting apparatus according to the present invention. The same components as in FIG. 12 shall bear the same reference numerals.

As shown in FIG. 1, the television signal received by the antenna 1 receiving television signals is fed to the RF amplifier 2, is amplified by this RF amplifier and is then output to the mixer 4. Here, in the mixer 4, the oscillated frequency fed from the separately provided oscillator (VCO) 3 which can vary the oscillated frequency and the frequency of the fed television signal are mixed with each other and a beat signal is produced as of a beat frequency equal to the difference between the two original frequencies and is fed to the IF amplifier 5. In the IF amplifier 5, the beat signal is amplified and is output to the IF circuit 8.

That is to say, the received television signal is amplified in the RF amplifier 2, is then heterodyned in the mixer 4 with the signal from the VCO 3 and is output. The so-called superheterodyne system tuner 6 is formed of the RF amplifier 2, VCO 3, mixer 4 and IF amplifier 5.

The role of the tuner 6 is to select a specific signal from the group of many electric waves of the output of the antenna 1, to control the oscillated frequency of the VCO 3 to be output as the IF signal 7, and to operate to adjust the frequency of the beat signal obtained in the mixer 4.

The output of the tuner 6 is led to the IF circuit 8 connected with the tuner 6 to be processed in the signal, is amplified in the IF amplifier 9 forming the IF circuit 8, is then demodulated as a base band video signal by the video signal detector 10, and is output to a video amplifying step (not illustrated) from the output terminal 30.

Therefore, this embodiment is characterized in that the frequency counter 23 is provided as connected to the output end of the tuner 6, the signal frequency of the output signal of the tuner 6 is measured with the frequency counter 23 and, on the basis of the measured results, the frequency dividing ratio of the variable frequency divider 13 is set by the microprocessor 21.

As mentioned above, the counter 23 measures the output signal of the tuner 6, that is, the signal frequency of the IF signal and outputs this measured result as data of the signal. The present state of the received signal frequency can be recognized by measuring the signal frequency of the input signal (IF signal) by this frequency counter 23. These measured signal data are fed to the microprocessor 21.

On the other hand, the same as in the conventional technique, the prescaler 12 is connected to the VCO 3 of the tuner 6. The PLL circuit 20 is provided to determine the oscillated frequency of the VCO 3 and operates so that the signal of the VCO 3 may be detected and divided in the frequency by the prescaler 12, then the signal divided in the frequency by the variable frequency divider 13 and the signal which the output from the high precision fixed oscillator 14 is divided by the fixed frequency divider 15 in the frequency are compared with each other in the phase by the phase comparator 16, as a phase compared result, the controlling voltage 17 of the VCO 3 is obtained by using the loop filter 18 and the oscillated frequency of the VCO 3 can be varied by this controlling voltage 17.

The data latch 19 is to take in the frequency dividing ratio of the variable frequency divider 13 from the microprocessor 21.

Thus, the PLL circuit 20 is formed of the prescaler 12, variable frequency divider 13, fixed oscillator 14, fixed frequency divider 15, phase comparator 16, controlling voltage 17, loop filter 18 and data latch 19 as one circuit block. The oscillated frequency of the VCO 3 is controlled by using this PLL circuit 20.

The operation of the channel selecting apparatus in this embodiment shall be explained in detail in the following with reference to FIG. 2.

By the way, any optional broadcast frequency fSIG offset, for example, from the state that the signal frequency (regular frequency fRF of 91.25 MHz) of the channel 1 is tuned shall be 91.5 MHZ and the case of tuning with this broadcast frequency fSIG shall be explained.

First of all, by using the microprocessor 21, the frequency is tuned with the broadcast signal frequency 91.25 MHz of the channel 1. In this case, so that the oscillated frequency of the VCO 3 may be a frequency of 150 MHz, the data latch 19 is set so that the frequency dividing ratio N of the variable frequency divider 13 may be 2400 by the control of the microprocessor 21. As a result, the signal frequency 91.25 MHz of the channel 1 can be tuned.

In case the broadcast signal frequency fSIG of 91.5 MHZ optionally offset from the state of receiving the signal frequency of this channel 1 is to be tuned, as it is now tuned with the broadcast signal frequency of the channel 1, the VCO 3 will be oscillating an oscillated frequency of 150 MHz. Here, as the transmitted broadcast signal frequency fSIG is 91.5 MHz, the frequency of the output signal (IF signal) of the tuner 6 will be $$fIF=150-91.5=58.5\ MHz.$$

Therefore, when compared with the intermediate frequency (fIF) of the regular signal, from the frequency receiving the broadcast signal of the channel 1 now, there will be a frequency difference of $$\Delta fIF=58.75-58.5=0.25\ MHz \quad (3)$$

Therefore, if this difference of the frequency part is shifted for the VCO 3, the now transmitted offset broadcast signal frequency fSIG signal will be able to be favorably and pertinently received.

That is to say, when the received frequency of the channel 1 is 91.25 MHz, the oscillated frequency fVCO of the VCO 3 will be 150 MHz and therefore the frequency dividing ratio N of the variable frequency divider will be set to be 2400. From this state, the frequency dividing ratio N corresponding to the frequency difference part (0.25 MHz) from the broadcast signal frequency fSIG calculated by the formula (3), that is, $\Delta N=4$ may be derived, and the variable frequency divider 13 may be controlled to correct this $\Delta N$ part, that is to say, the frequency dividing ratio data to which such $\Delta N$ as is mentioned above is added may be set in the data latch 19 by using microprocessor 21.

Figure 2:
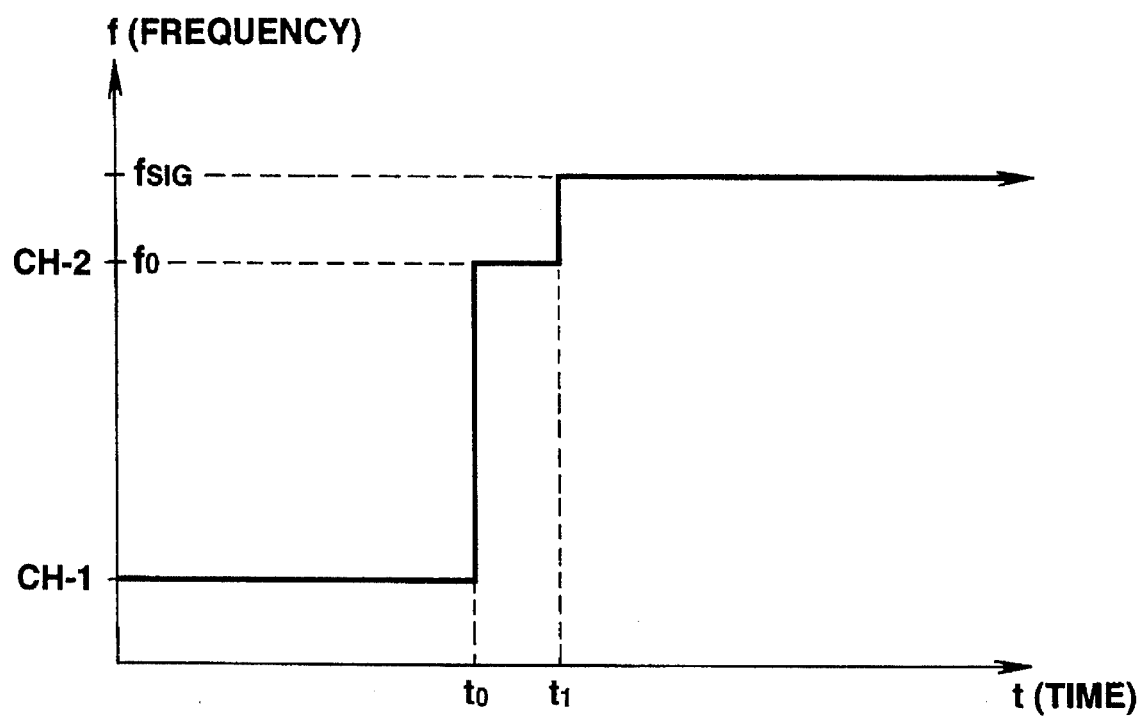
FIG. 2 is an explanatory view for explaining the operation of the apparatus shown in FIG. 1.
Figure 13:
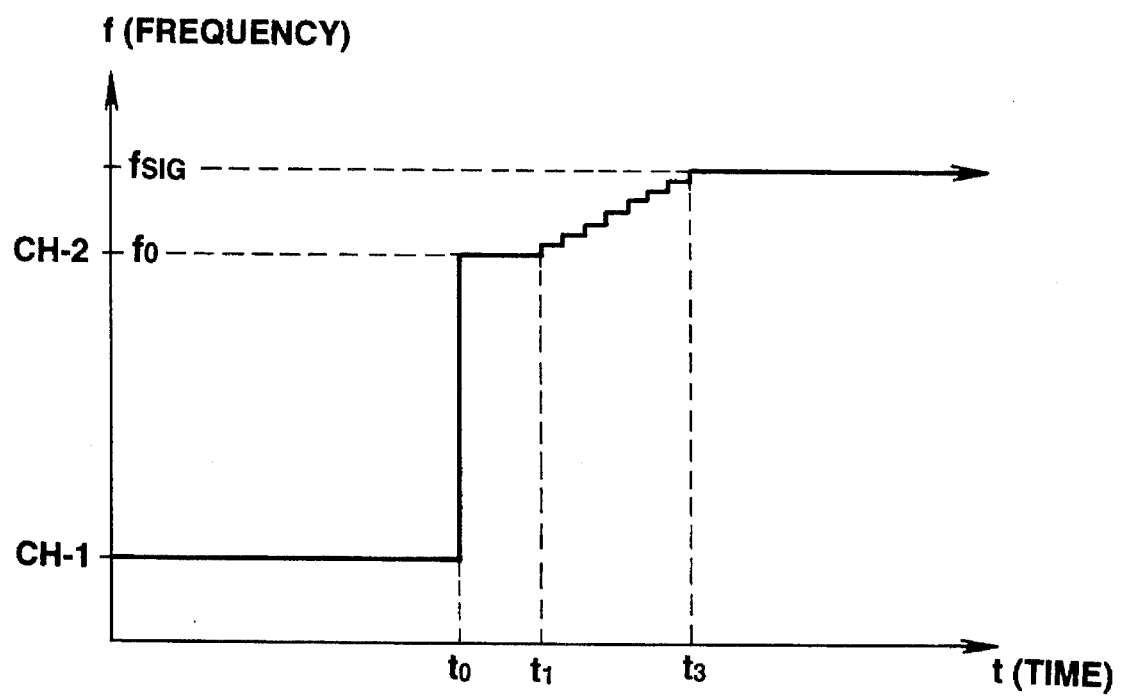
FIG. 13 is an explanatory view for explaining the operation of the apparatus shown in FIG. 12.

Thereby, the time while, for example, as shown in FIG. 2, the broadcast signal frequency of the channel 1 is received, the broadcast signal frequency of the channel 2 of the regular frequency is received and then an optionally offset broadcast signal frequency fSIG is received and tuned can be more reduced than in the conventional technique. That is to say, according to this embodiment, the tuning time (See FIG. 13) from the time t1 of tuning the channel 2 shown by the regular frequency f0 to the time t3 of tuning the broadcast signal frequency fSIG can be omitted. It is clear that the optional broadcast signal frequency can be favorably tuned and the performance of the channel selecting apparatus can be improved.

Figure 3:
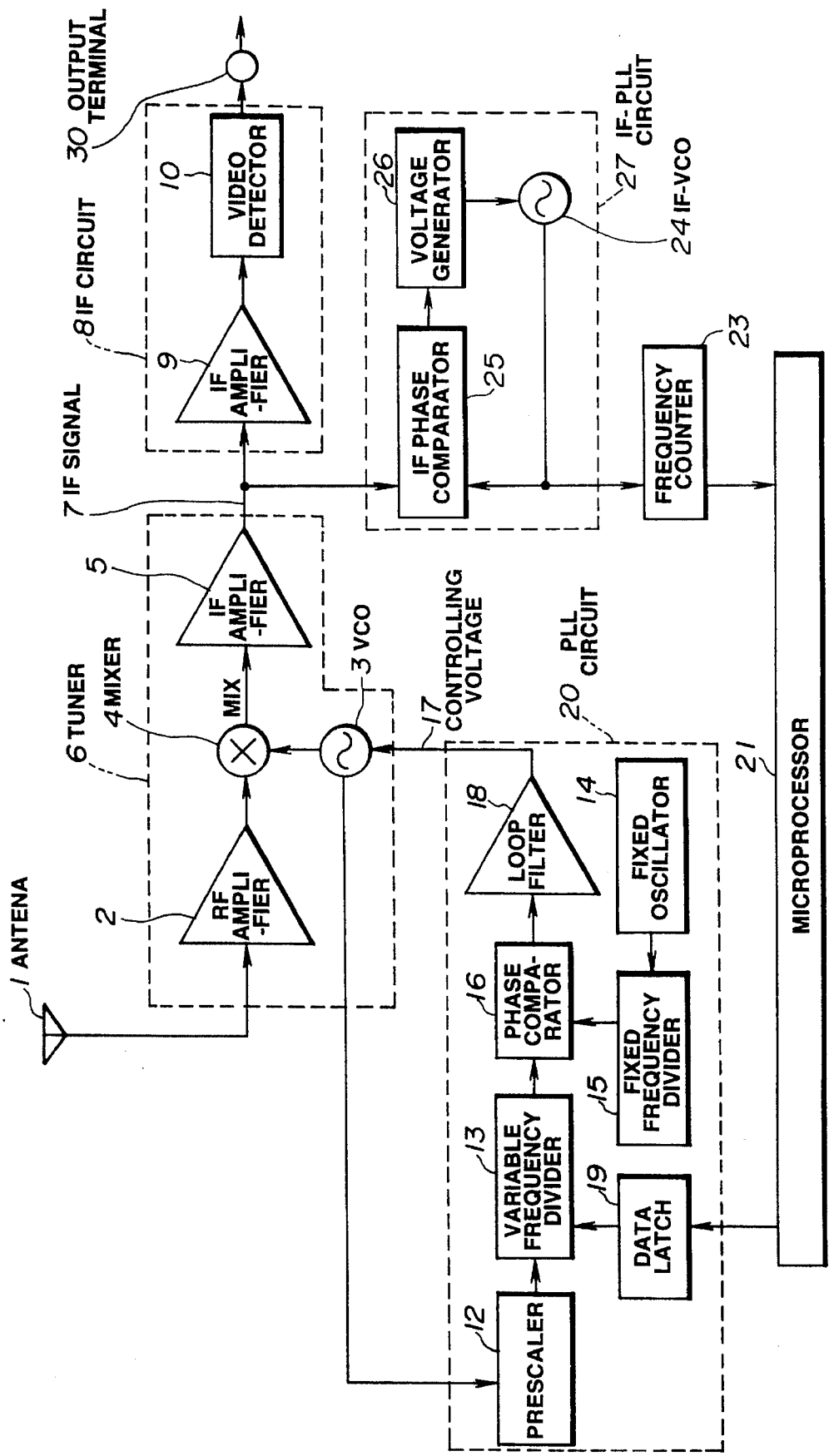
FIG. 3 is a block diagram showing the second embodiment of a channel selecting apparatus according to the present invention.

FIG. 3 is a block diagram showing the second embodiment of the channel selecting apparatus according to the present invention. The same components as in the apparatus shown in FIG. 1 shall bear the same reference numerals and shall not be explained. Only different parts shall be explained.

This embodiment is characterized in that, as shown in FIG. 3, for example, the same as in the embodiment, a frequency counter 23 measuring the signal frequency of the output signal of the tuner 6 is provided and, further, in order that the signal frequency counting measuring operation by this frequency counter 23 may be favorably made, an IF-PLL circuit 27 operating to pull in the output signal of the tuner 6 is provided between this frequency counter 23 and the tuner 6.

Here, as shown in FIG. 1, the embodiment is of a method of directly measuring the frequency of the output signal of the tuner 6 by using the frequency counter 23. However, in case, for example, the broadcast signal is overmodulated, the frequency counting operation by the frequency counter 23 will be influenced.

Therefore, in this embodiment, in order to dissolve such problems, instead of directly measuring the signal frequency of the output frequency of the tuner 6 by using the frequency counter 23, an IF-PLL circuit 27 operating to pull in the output signal of the tuner 6 is provided and the output of the oscillated frequency circuit (called an IF-VCO) 24 of this IF-PLL circuit 27 is connected to the frequency counter 23 and the frequency is positively measured.

As shown in FIG. 3, the IF-PLL circuit 27 comprises an IF phase comparator 25 comparing the phase differences of the frequency of the output signal of the tuner 6 and the frequency oscillated by the IF-VCO 24, a voltage generator 26 producing and outputting an oscillated frequency controlling voltage on the basis of the result of comparing the phases by this IF phase comparator 25 and an IF-VCO 24 oscillating the frequency corresponding to the oscillated frequency controlling voltage fed from this voltage generator 26.

The frequency counter 23 counts the frequency of the output signal of the IF-PLL circuit 27 and feeds these frequency counted data to the microprocessor 21 the same as in the embodiment.

The operation of this embodiment shall be explained in detail in the following with reference to FIG. 3.

By the way, in this embodiment, the operations of the tuner 6, IF circuit 8 and PLL circuit 20 are the same as in the embodiment and the explanation shall be omitted but the operation of the IF-PLL circuit 27 as a main part shall be explained.

For example, in case the signal frequency of the output signal of the tuner 6 shown in FIG. 3 is, for example, a regular frequency, the IF phase comparator 25 which makes the output signal of the tuner 6 an input signal compares the phase differences of the frequency of the input signal from this tuner 6 and the signal frequency oscillated by the IF-VCO 24 generating the regular frequency in advance. That is to say, as the phases are the same, on the basis of the phase compared results of the IF phase comparator 25, the voltage generator 26 will feed a fixed oscillated frequency controlling voltage to the IF-VCO 24.

Thereby, the IF-VCO 24 will oscillate a frequency corresponding to the fixed oscillated frequency controlling voltage, that is, the regular frequency. Thereafter, the signal oscillated in the regular frequency by the IF-VCO 24 will be counted (measured) by the frequency counter 23 in the frequency, that is to say, the frequency measured data of the gas positively measured in the frequency will be able to be fed to the microprocessor 21.

As the IF phase comparator 25 is always comparing in the phase the frequency of the input output signal of the tuner 6 and the frequency of the signal oscillated from the IF-VCO 24 with each other and is formed to inhibit the frequency fluctuation with a fixed time constant, in case the output signal of the tuner 6 is, for example, any optional frequency, the frequency of the output signal of the IF-VCO 24 and the frequency of the output signal of the tuner 6 will be compared with each other and, as a result of this phase comparison, the oscillated frequency controlling voltage from the voltage generator 26 will vary, that is to say, the oscillated frequency of the IF-VCO 24 will output a signal of such frequency as will be of the same phase as of the output frequency of the tuner 6.

Thereby, even in case the frequency of the output signal of the tuner 6 is any optional frequency, the output signal frequency of this tuner 6 will be able to be positively fed to the frequency counter 23, the frequency will be very accurately counted by using this frequency counter 23 and the frequency count data of the broadcast signal will be able to be fed to the microprocessor 21 the same as mentioned above.

Therefore, according to this embodiment, even in case the frequency of the output signal of the tuner 6 is the regular frequency or any optional frequency, by using the IF-PLL circuit 27 and frequency counter 23, in response to the frequency of the output signal of the tuner 6, the frequency will be able to be positively measured and, even in case a minute input signal, that is, a feeble electric field is input or a signal high in the modulated degree is received, the output frequency of the IF-VCO 24 as an oscillating circuit will be measured and therefore the frequency will be able to be stably measured.

Also, the frequency count data very positively measured in the frequency can be fed to the microprocessor 21. Thereby, on the basis of these frequency count data, by using the microprocessor 21, the same as in the first embodiment, by feeding the frequency dividing ratio of the variable frequency divider 13, that is, the corrected data ΔN part of the frequency dividing ratio to the data latch 19, the frequency dividing ratio of the variable frequency divider is varied and, as a result, the VCO 3 of the tuner 6 can oscillate an oscillated frequency based on the frequency count data and the broadcast signal can be favorably tuned.

Figure 4:
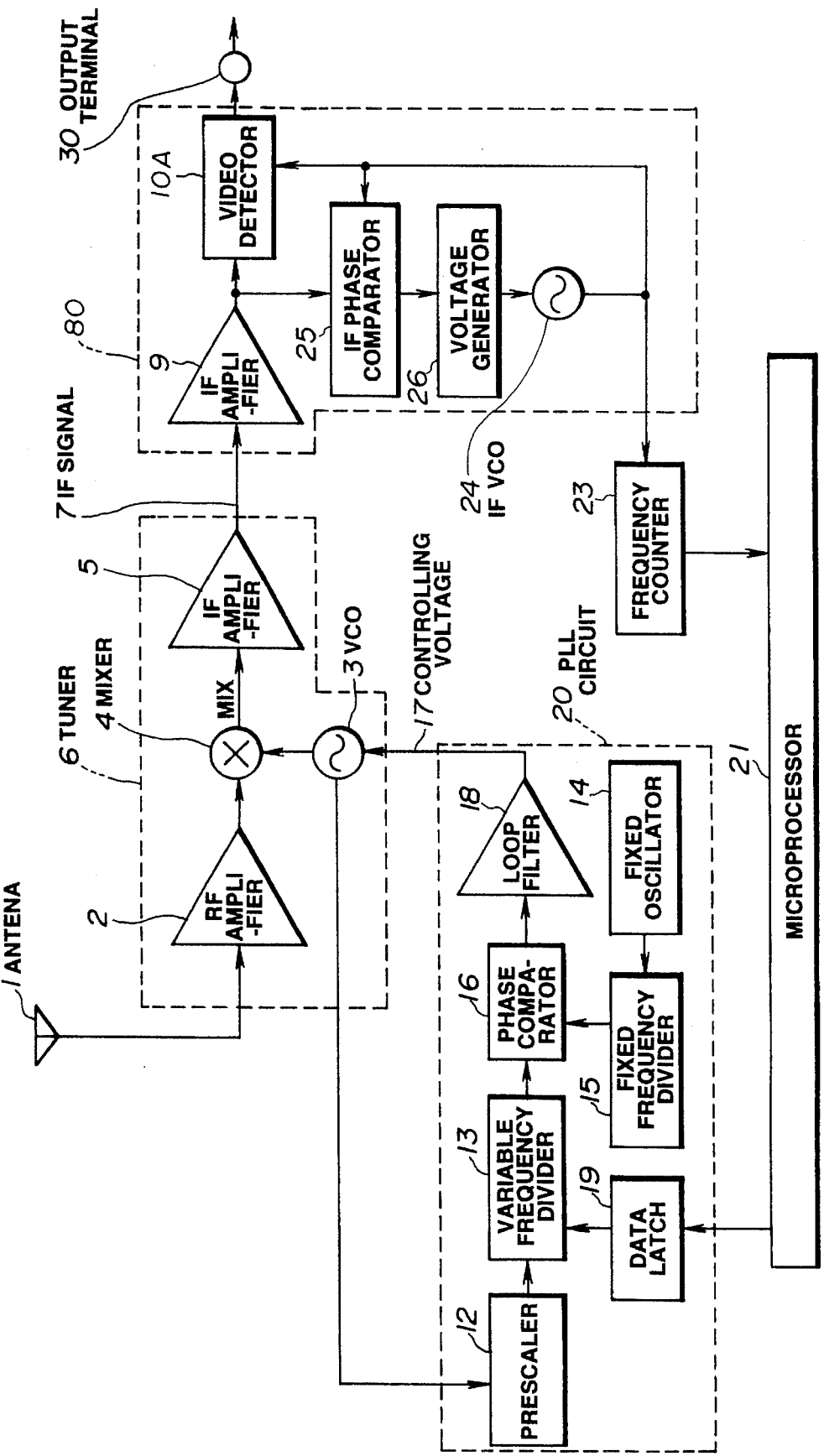
FIG. 4 is a block diagram showing the third embodiment of a channel selecting apparatus according to the present invention.

FIG. 4 is a block diagram showing the third embodiment of the channel selecting apparatus according to the present invention. The same components as in the apparatus shown in FIG. 3 shall bear the same reference numerals and shall not be explained. Only different parts shall be explained.

As shown in FIG. 4, this embodiment is characterized in that, for example, the IF-PLL circuit 27 (See FIG. 3) used in the second embodiment is used as an oscillating circuit producing the reference IF signal used for the synchronizing type demodulation of the IF signal, that is to say, the IF-PLL circuit 27 is used simultaneously to measure the frequency and to generate the IF signal for the synchronized detection.

Thus, the frequency is not measured directly as of an input signal from the output signal of the tuner 6 characterized by the first and second embodiments, the output signal of the tuner 6 is fed to the circuit part 80 formed of the IF circuit and IF-PLL circuit to have the frequency measured and, on the other hand, the locked oscillated signal of the IF-PLL circuit is fed as a reference signal for the synchronized detection to the video synchronized detecting circuit 10A. That is to say, the output signal of the tuner 6 is fed to the IF amplifier 9, the signal amplified to a predetermined level in this IF amplifier is fed as an input signal to the IF phase comparator 25 and an accurate signal frequency is obtained by using the voltage generator 26 and IF-VCO 24 the same as in the embodiment, is utilized as the above described synchronized detecting reference signal and is fed to the frequency counter 23 so that accurate frequency measured data may be obtained. It is needless to say that the other operations are the same as in the embodiment and the same effects can be obtained.

According to the above described first to third embodiments, even in case the broadcast signal not transmitted with the regular frequency is to be received, the time until the signal is tuned will not become long, the signal will be able to be positively regularly tuned and not only the selectability or tunability will be improved but also a wide frequency broadcast channel will be able to be selected.

Figure 5:
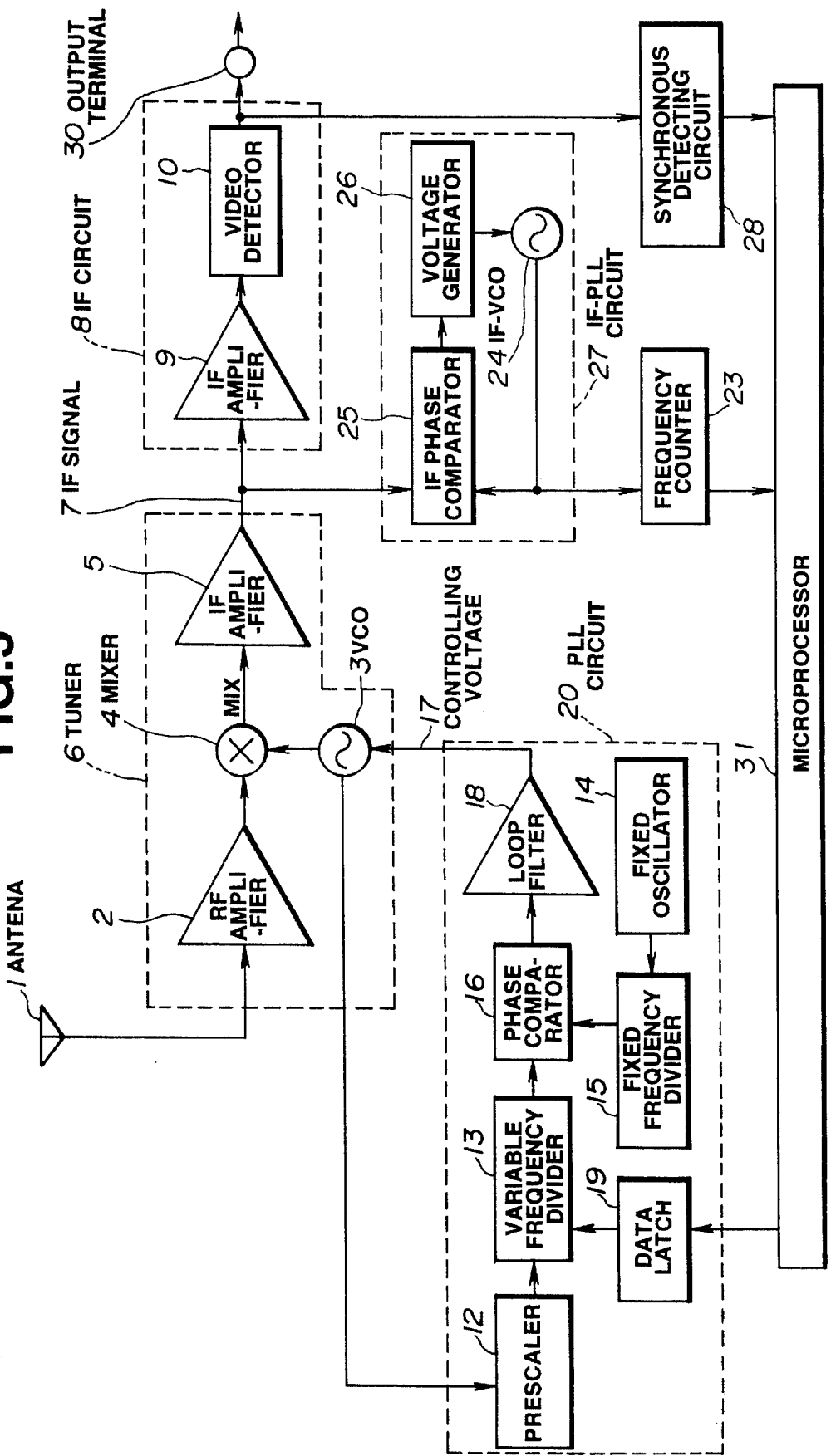
FIG. 5 is a block diagram showing the fourth embodiment of a channel selecting apparatus according to the present invention.

FIG. 5 is a block diagram showing the fourth embodiment of the channel selecting apparatus according to the present invention. In FIG. 5, the same components as in the apparatus shown in FIG. 3 shall bear the same reference numerals and shall not be explained. Only different parts shall be explained. The apparatus in FIG. 5 is different from that in FIG. 3 in the presence of the synchronous detecting circuit 28 and the controlling method by the microprocessor 31.

In FIG. 5, the television signal (RF signal) received by the antenna 1 is fed to the RF amplifier 2, is amplified by the RF amplifier 2 and is output to the mixer 4. In the mixer 4, the frequency fed from the separately provided VCO 3 capable of varying the oscillated frequency and the frequency of the fed television signal are mixed together to produce a beat signal of a beat frequency equal to the difference between the two original frequencies and the produced signal is fed to the IF amplifier 5. In the IF amplifier 5. the beat signal from the mixer 4 is amplified and is output to the IF circuit 8. Therefore, the received television signal is amplified by the RF amplifier 2, is then heterodyned by the mixer 4 with the signal from the VCO 3 and is output. That is to say, the RF amplifier 2, VCO 3, mixer 4 and IF amplifier 5 form the so-called superheterodyne system tuner 6. Therefore, the tuner 6 selects a signal of a specific frequency from a group of many television signals received by the antenna 1, controls the oscillated frequency of the VCO 3 to to be output as an IF signal 7 and further operates to adjust the frequency of the beat signal obtained by the mixer 4.

The output signal (IF signal 7) of the tuner 6 is fed to the IF circuit 8 connected to the tuner 6 to be processed and is amplified by the IF amplifier 9 forming the IF circuit 8. Then, the amplified IF signal is demodulated to a base band video signal by the video detector 10 and is output to a video amplifying step (not illustrated). Also, the base band signal from the video detector 10 is fed to the synchronous detecting circuit 28 which detects a synchronous signal from the base band signal and feeds it to the microprocessor 31. On the basis of the fed synchronous signal, the microprocessor 31 distinguishes the presence or absence of the television broadcast wave and the video carrier wave or sound carrier wave.

On the other hand, the output signal (IF signal 7) of the tuner 6 is fed also to the IF-PLL circuit 27. The IF-PLL circuit 27 comprises the IF phase comparator 25 which compares the phase differences of the frequency of the output of the tuner 6 and the frequency oscillated by the IF-VCO 24, voltage generator 26 which produces and outputs an oscillated frequency controlling voltage on the basis of the result of comparing the phases by this IF phase comparator 25 and IF-VCO 24 which oscillates the frequency corresponding to the oscillated frequency controlling voltage fed from the voltage generator 26 and can vary the oscillated frequency. Further, the frequency counter 23 which counts the frequency of the output signal of the IF-PLL circuit 27 and outputs the frequency as frequency count data to the microprocessor 31 is connected to this IF-PLL circuit 27. That is to say, the IF-PLL circuit 27 is pulled in the output signal of the tuner 6 and, even in case the input broadcast signal is, for example, overmodulated, by measuring the output frequency of the IF-PLL circuit 27 by the frequency counter 23, the frequency of the output signal of the IF-PLL circuit 27 will be able to be positively measured.

Now, a prescaler 12 dividing the oscillated frequency of the VCO 3 is connected to the output terminal of the VCO 3 of the tuner 6. Further, a loop filter 18 feeding the controlling voltage 17 for varying the oscillated frequency of the VCO 3 is connected to the input terminal of the VCO 3. That is to say, in order to determine the oscillated frequency of the VCO 3, this channel selecting apparatus is provided with the PLL circuit 20 of one circuit block (the part enclosed with the dotted line in FIG. 5) comprising the prescaler 12 inputting the oscillated frequency from the VCO 3, variable frequency divider 13, fixed oscillator 14, fixed frequency divider 15, phase comparator 15, data latch 19 and loop filter 18 outputting the controlling voltage 17 to the VCO 3.

In the PLL circuit 20, in order to determine the oscillated frequency of the VCO 3, the signal (oscillated frequency) of VCO 3 is detected, is divided in the frequency by the prescaler 12, is then further divided in the frequency by the variable frequency divider 13, this frequency divided signal and the signal from the high precision fixed oscillator 14 are compared in the phase with each other by the phase comparator 16, from the result of comparing the phases, the controlling voltage 17 of the VCO 3 is obtained by using the loop filter 18 and the oscillated frequency of the VCO 3 can be varied by this controlling voltage 17. By the way, the data latch 19 is to take in the frequency dividing ratio of the variable frequency divider 13 from the microprocessor 31 arranged outside.

The microprocessor 31 produces the frequency dividing ratio by operating the frequency count data fed from the frequency counter 23, feeds this frequency dividing ratio to the data latch 19 and controls the lock frequency by the PLL circuit 20. Further, in case the offset signal frequency SIG is to be received from the regular frequency, the microprocessor 31 in this embodiment will output a frequency dividing ratio so that the regular frequency may not first receive it but any set frequency (which shall be mentioned as a set frequency fIST hereinafter) set optionally in advance may receive it, will calculate and operate the frequency difference between the set frequency fIST measured by the frequency counter 23 and the offset signal frequency fSIG and will output a frequency dividing ratio for receiving the offset signal frequency fSIG. Thus, the microprocessor 31 feeds the frequency dividing ratio to the data latch 19 to correct the frequency and controls the frequency to be tuned with the offset signal frequency fSIG. By the way, the frequency of the set frequency fIST need not be limited but it is desirable to shift the difference between the video signal output frequency of the tuner 6 and the intermediate range of the signal band from the tuner band video signal frequency to the narrow frequency side.

The operation of the channel selecting circuit of such formation shall be explained in the following.

For example, the case of receiving a signal frequency fSIG optionally offset from the video signal broadcast frequency fRF of the channel 2 among a plurality of broadcast channels in Japan shall be explained. By the way, the frequency relation of both in this case is that the video broadcast signal frequency fRF (which shall be mentioned as fP2 hereinafter) of the channel 2 is a frequency of 97.25 MHz and, on the other hand, the offset signal frequency fSIG is a frequency of 99.25 MHz. Further, the set frequency fIST is assumed to be set at fP2-2 (MHz).

Now, it is assumed that the received frequency fP1 (91.25 MHz) of the channel 1 tuned by the channel selecting apparatus is changed to an offset signal frequency fSIG. In this case, first of all, the microprocessor 31 will operate the frequency dividing ratio for receiving the set frequency fIST and will feed this operated frequency dividing ratio to the data latch 19.

That is to say, as the regular frequency fP2 of the channel 2 is 97.25 MHz, the set frequency fIST will be:

$$fIST = fP2 - 2 \text{ (MHz)}$$
$$= 97.25 - 2 = 95.25 \text{ (MHz)}.$$

Therefore, as the intermediate frequency fIF is 58.75 MHz, the oscillated frequency fVCO of the VCO 3 to be tuned with this set frequency fIST will be shown by the formula (1) to be:

$$fVCO = fIF + fIST = 58.75 + 95.25$$
$$= 154 \text{ (MHz)}.$$

Therefore, the frequency dividing ratio N to be fed from the microprocessor 31 to the data latch 19 will be from the formula (2):

$$N = 154000/62.5 = 2464.$$

The microprocessor 31 feeds the frequency dividing ratio data obtained thus by the operation to the data latch 19 and controls the frequency dividing ratio N of the variable frequency divider 13 to be set as 2464. Therefore, the signal obtained by dividing in the frequency the signal input from the prescaler is compared in the phase with the reference frequency based on the frequency dividing ratio from the fixed frequency divider 15 by using the phase comparator 16 and a controlling voltage 17 corresponding to this compared result will be output to the VCO 3 from the loop filter 18. That is to say, the PLL circuit 20 varies the lock frequency to oscillate the oscillated frequency by the VCO 3 as an oscillated frequency of 154 MHz and feeds a controlling voltage 17 based on this lock frequency to the VCO 3. Therefore, the oscillated frequency of 154 MHz will be output to the mixer 4 by the VCO 3 and the tuner 6 will be tuned with the set frequency of fIST of 95.25 MHz. Thus, the channel selecting apparatus can switch the tuned state of the channel 1 to the tuned state of the set frequency fIST.

Then, the tuning is shifted from this tuned state of the set frequency fIST to any optionally offset broadcast frequency fSIG (99.25 MHz). In this case, as the frequency is now tuned with the signal frequency (95.25 MHz) of the set frequency fIST, the VCO 3 will be oscillating an oscillated frequency of 154 MHz. Further, as the transmitted offset signal frequency fSIG is 99.25 MHz, in the case of being tuned with this broadcast signal frequency fSIG, the video signal output frequency fIF of the output signal of the tuner 6 will be able to be shown from the formula (1) to be:

$$fIF = fVCO - fSIG \quad = \quad 154 - 99.25$$
$$= \quad 54.75 \text{ (MHz)}.$$

For example, in this step, when the output signal (54.75 MHz) of the tuner 6 is pulled in, the frequency is measured by the frequency counter 23 and this measured signal frequency and the intermediate frequency fIF(58.75 MHz) of the regular signal are compared with each other, such frequency difference ΔfIF as in the following will be had:

$$\Delta fIF = 58.75 - 54.75 = 4.00 \text{ (MHz)}.$$

This shows that the offset signal frequency fSIG is set to be higher by 4.00 (MHz) than the now received set frequency fIST.

For example, if the amount of the correction of the frequency dividing ratio to the offset amount is ΔN, it will be:

$$\Delta N = 4000/62.5 = 64.$$

Further, when it is tuned with the set frequency fIST, the frequency dividing ratio will be 2464. If the corrected frequency dividing ratio is N, as said ΔN part is offset to be high in the signal frequency fSIG, when the offset signal frequency fSIG is tuned, the frequency dividing ratio N will be able to be shown to be:

$$N = 2464 + 64 = 2528.$$

Therefore, if the frequency dividing ratio N of the variable frequency divider 13 is set to be the frequency dividing ratio (N=2528) shown above by the control by the microprocessor 31, as the oscillated frequency of the VCO 3 is shifted, the signal of the now transmitted offset broadcast signal frequency fSIG will be able to be favorably and pertinently received. Thus, the channel selecting apparatus can tune with the offset signal frequency fSIG through the tuning with the set frequency fIST from the tuned state of the channel 1.

Figure 6:
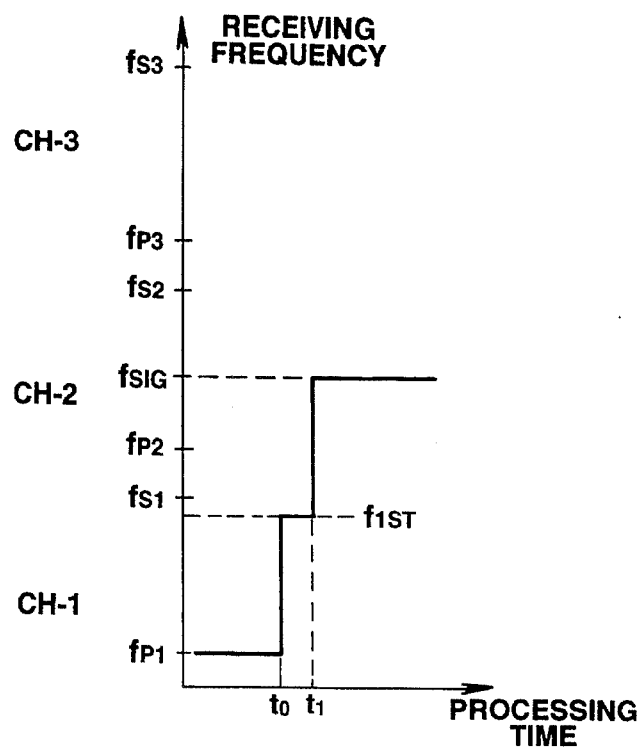
FIG. 6 is an explanatory view for explaining the operation of the apparatus shown in FIG. 5 in case the frequency is offset to be higher than the regular frequency.

The operation of the channel selecting apparatus in this case is shown in FIG. 6. By the way, the ordinate shown in FIG. 6 represents the received frequency and the abscissa represents the processing time.

In the channel selecting apparatus of this embodiment, as shown in FIG. 6, for example, in case the regular signal frequency fP1 of the channel 1 is to be tuned with the signal frequency fIST offset to be higher than the regular signal frequency fP2 of the channel 2, as described above, first, at the processing time t0, the set frequency fIST will be received, then, at the processing time t0 to t1, the correction amount ΔN of the frequency dividing ratio based on the frequency difference between the set frequency fIST and the offset signal frequency fSIG will be added to the frequency dividing ratio N of the variable frequency divider 13 in this receiving state and the frequency dividing ratio of the variable frequency divider 13 will be set again. When the frequency is thus corrected by the microprocessor 31, at the processing time t1, the offset signal frequency fSIG will be able to be received. Further, according to such channel selecting method, the channel 2 need not be tuned first. There is an advantage that the tuning time from the tuning time t0 of the set frequency fIST to the tuning time t1 of the offset signal frequency fSIG can be reduced.

The case that the signal frequency fSIG offset to be lower than the regular frequency is received by such channel selecting method shall be explained in detail in the following with reference to FIG. 7.

Figure 7:
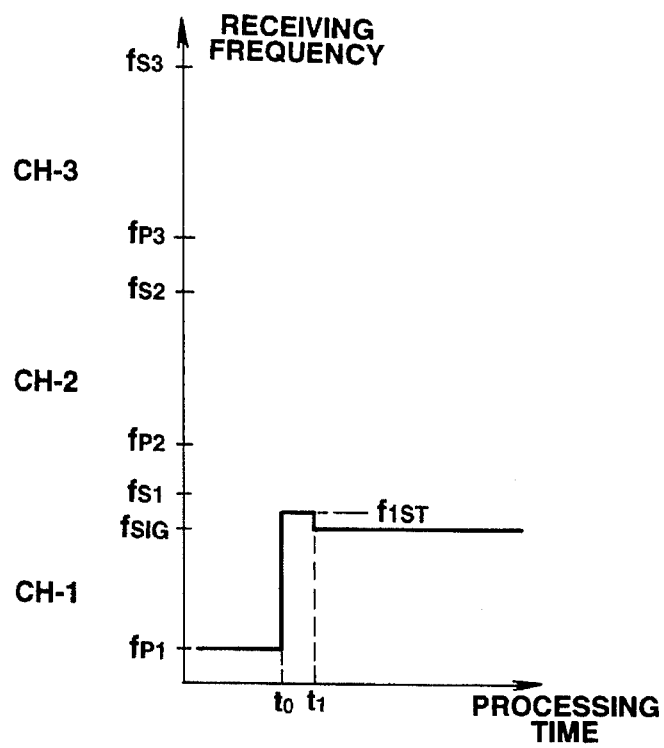
FIG. 7 is an explanatory view for explaining the operation of the apparatus shown in FIG. 5 in case the frequency is offset to be lower than the regular frequency.

FIG. 7 is an explanatory view for explaining the operation of the channel selecting apparatus when the signal frequency fSIG offset to be lower than the signal frequency fP2 of the channel 2 is to be tuned. By the way, in FIG. 7, the ordinate represents the received frequency and the abscissa represents the processing time.

For example, the video broadcast signal frequency fP2 of the channel 2 shall be a frequency of 97.25 (MHz) and the signal frequency fSIG offset to be low shall be a frequency of 94.75 (MHz). Further, the set frequency fIST is set to be fP2-2 (MHz) (=95.25 MHz) the same as in the above.

Now, the received frequency fP1 (91.25 MHz) of the channel 1 tuned by the channel selecting apparatus is changed to the signal frequency fSIG offset to be lower than the signal frequency fP2 of the channel 2 and is tuned. In this case, too, the channel selecting apparatus will operate the same as in the case that the signal frequency fSIG offset to be higher than the regular signal frequency is received. That is to say, first of all, the microprocessor 31 will operate the frequency dividing ratio for receiving the set frequency fIST and will feed it to the data latch 19. Then, the frequency dividing ratio of the variable frequency divider 13 will be switched, that is, the lock frequency of the PLL circuit 20 will be varied and locked. The controlling voltage 17 for receiving the set frequency fIST will be output from the loop filter 18 and will be fed to the VCO 3. Therefore, as shown in FIG. 3, first of all, at the processing time t0, the set frequency fIST will be tuned.

When the video signal output frequency fIF of the tuner 6 at this time is shown, as it is now tuned with the set frequency fIST, the oscillated frequency fVCO of the VCO 3 will be 154 (MHz) and therefore will be able to be shown from the formula (1) to be:

$$fIF = fVCO - fSIG \quad = \quad 154 - 94.75$$
$$= \quad 59.25 \text{ (MHz)}.$$

Then, in the channel selecting apparatus, in order to correct the frequency to be tuned with the offset signal frequency fSIG from the tuned state with the set frequency fIST, the IF signal 7 from the tuner 6 is taken in and the frequency is measured by the frequency counter 23.

However, as the IF signal 7 from the tuner 6 is input in the frequency counter 23, the signal to be measured in the frequency by the frequency counter 23 will be limited in the band by the output characteristics of the tuner 6.

In case the remaining side wave band signal has a sound signal intercarried in a high frequency from the video signal as in the television broadcast, for example, in Japan, it will be general to characterize that the tuner 6 has a range of sound signals from the remaining side wave band of video signals. Therefore, in the range of the operation of pulling in the frequency, the range from the remaining side wave band of the video signal to the sound signal will be the largest range. Therefore, in case the frequency is pulled in by the method using the frequency counter 23, in the largest pulling-in range, in the broadcast signal of a frequency lower than the regular frequency, substantially the remaining side wave band range (0.5 MHz) will be a lower limit and, on the other hand, in the broadcast signal of a frequency higher than the regular frequency, substantially the remaining side wave band range (4.5 MHz) will be an upper limit. That is to say, if the frequency range at this time is represented by fAREA, it will be able to be shown by:

fAREA 54.25–59.25 (MHz)

with the regular IF frequency (58.75 MHz) in the center.

In the channel selecting apparatus of this embodiment, as mentioned above, as the pulled-in frequency range can be secured as shown by the IF signal of 59.25 (MHz), the tuner 6 will be able to output the IF signal 7. Thereby, as the IF signal 7 can be input into the frequency counter 23, the frequency will be able to be detected by the frequency counter 23.

Therefore, the IF-PLL circuit 27 pulls in the output signal (59.25 MHz) of the tuner 6 and then the frequency is measured by the frequency counter. In this case, when this measured signal frequency and the intermediate frequency fIF (58.75 MHz) of the regular signal are compared with each other, they will be found to have such frequency difference ΔfIF as in the following:

$$\Delta fIF = 58.75 - 59.25 = -0.50 \ (MHz).$$

This shows that the offset signal frequency fSIG is offset to be higher by −0.50 (MHz) than the now received set frequency fIST.

For example, if the correction amount of the frequency dividing ratio against the offset amount is represented by ΔN, it will be:

$$\Delta N = 500/62.5 = 8.$$

Further, if the frequency dividing ratio when the set frequency fIST is tuned is 2464 and the corrected frequency dividing ratio is N, as the signal frequency fSIG is offset so that the ΔN may be high, the frequency dividing ratio N when the offset signal frequency fSIG is tuned will be able to be shown to be:

$$N = 2464 - 8 = 2456.$$

Therefore, if the frequency dividing ratio N of the variable frequency divider 13 is set to be the frequency dividing ratio (N=2456) shown in the above by the control by the microprocessor 31, the oscillated frequency of the VCO 3 will be shifted and therefore the signal of the now transmitted offset broadcast signal frequency fSIG will be able to be favorably and pertinently received. Thus, the channel selecting apparatus can be tuned with the offset signal frequency fSIG through the tuning of the set frequency fIST from the tuned state of the channel 1.

Therefore, according to this embodiment, even in case the signal frequency fSIG offset to be lower than the regular frequency is to be received, as first the set frequency fIST is operated to be received, the output signal pulling-in frequency range of the tuner 6 will be able to be optimally secured. Therefore, the now received set frequency fIST can be measured by the frequency counter 23 and the frequency can be corrected to receive the offset signal frequency. Therefore, the offset signal frequency can be positively received. That is to say, the signal frequency offset to be higher or lower than the regular broadcast frequency can be favorably tuned.

Figure 8:
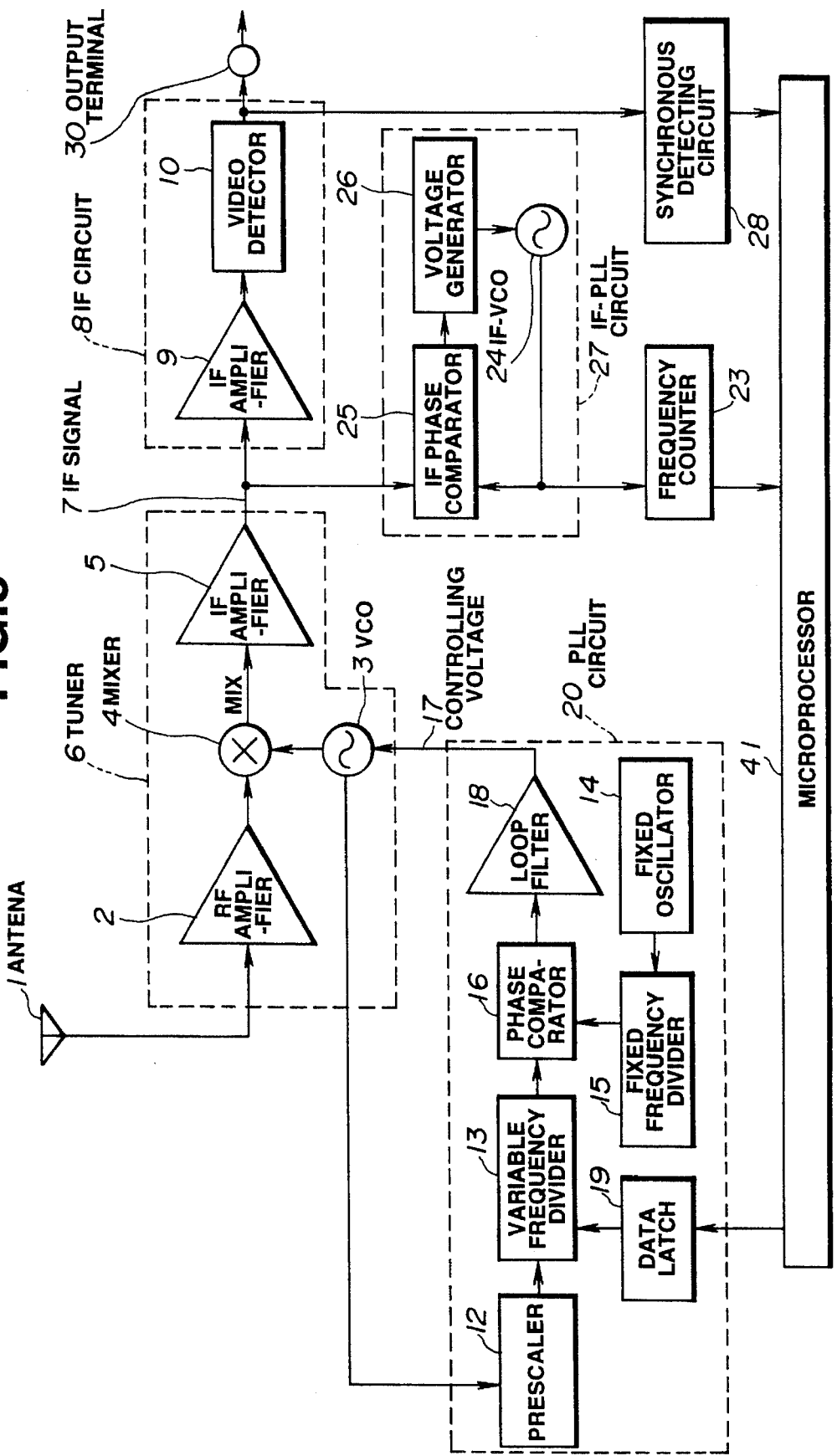
FIG. 8 is a block diagram showing the fifth embodiment of a channel selecting apparatus according to the present invention.

FIG. 8 is a block diagram showing the fifth embodiment of the channel selecting apparatus according to the present invention. The same components as of the apparatus shown in FIG. 5 shall bear the same reference numerals and shall not be explained. Only different parts shall be explained.

In the channel selecting apparatus in this embodiment, the circuit formation is the same as in the embodiment shown in FIG. 5 but the controlling method by the microprocessor 41 is different.

In FIG. 8, the microprocessor 41 operates the frequency count data fed from the frequency counter 23 the same as in the embodiment, produces a frequency dividing ratio, feeds this frequency dividing ratio to the data latch 19 and controls the lock frequency by the PLL circuit 20. In the case of tuning the offset signal frequency from the regular frequency tuned state, the microprocessor 41 will detect the frequency difference between them, will operate and calculate the frequency dividing ratio based on this frequency difference and will feed the frequency dividing ratio to the data latch 19 to correct the frequency. Further, in case the frequency is corrected to receive any optional offset signal frequency, the microprocessor 41 in this embodiment will detect the frequency of the now received signal, will process to judge whether there is a signal carrier or not and will process to judge whether it is a television signal of the NTSC system or not. Then, the microprocessor 41 will process to correct the frequency on the basis of a predetermined frequency relation so as to receive the regular frequency or the video signal carrier frequency in response to the judgment result.

Figure 9:
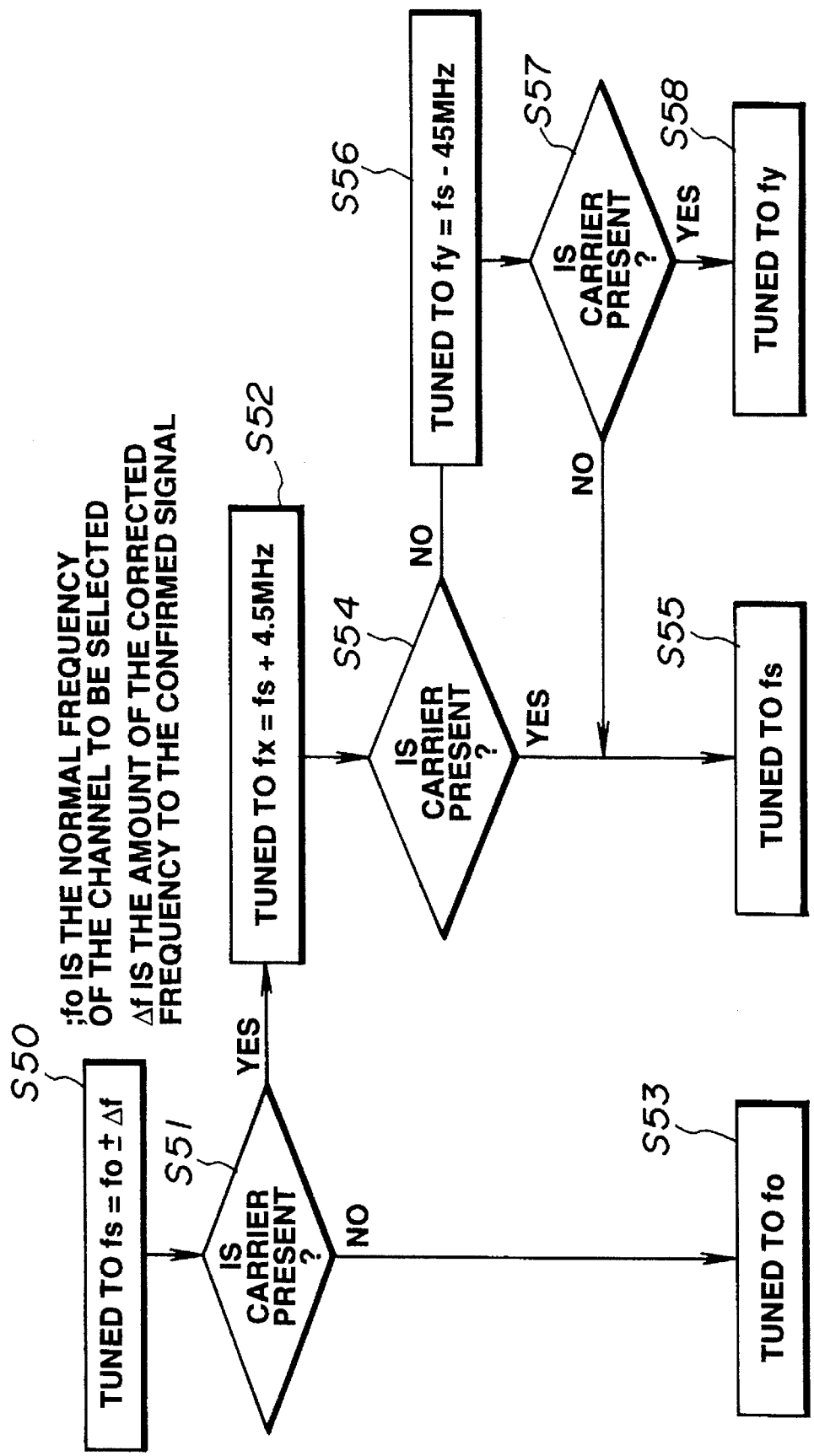
FIG. 9 is a flow chart showing the operation of the microprocessor shown in FIG. 8.

For example, in case the channel selecting apparatus receives a television signal of the NTSC system, as shown in FIG. 9, the microprocessor 41 will control to process to detect and tune the broadcast signal.

The operation of the channel selecting apparatus shown in FIG. 9 of this embodiment shall be explained in detail in the following with reference to FIGS. 6 and 7.

Figure 10:
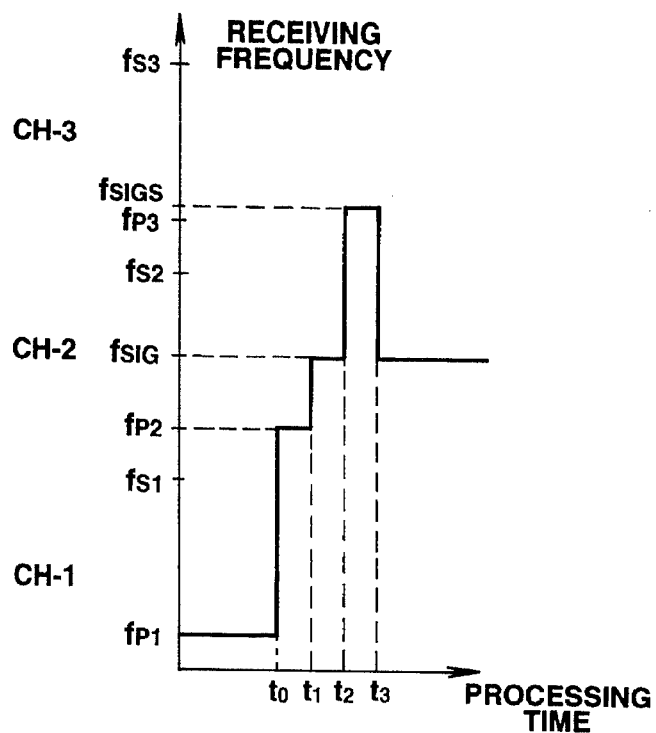
FIG. 10 is an explanatory view for explaining the operation of the apparatus shown in FIG. 8 in case the frequency is offset to be higher than the regular frequency.
Figure 11:
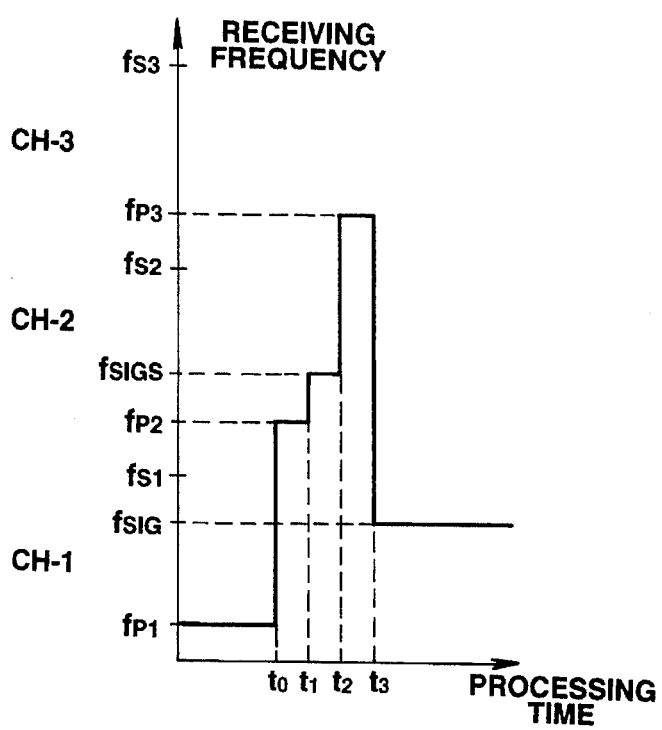
FIG. 11 is an explanatory view for explaining the operation of the apparatus shown in FIG. 8 in case the frequency is offset to be lower than the regular frequency.

FIG. 9 is a flow chart showing the detecting and tuning process controlling operation of the microprocessor in the channel selecting apparatus of this embodiment. FIGS. 10 and 11 are explanatory views for explaining the operation of the channel selecting apparatus. By the way, f0 shown in FIG. 9 represents the regular frequency of any optional channel, Δf represents a corrected frequency amount, fS represents an offset signal frequency corrected by the corrected frequency amount Δf from the regular frequency f0. Further, FIGS. 10 and 11 show the received frequency in the ordinate and the processing time in the abscissa and show the video carrier frequency of the offset signal as fSIGS.

For example, the case of receiving a signal frequency fSIG optionally offset from the video signal broadcast frequency fRF of the channel 2 among a plurality of broadcast channels in Japan shall be explained. By the way, the video broadcast signal frequency fP2 of the channel 2 shall be a frequency of 97.25 MHz and the offset signal frequency fSIG shall be a frequency of 99.25 MHz.

Now, the received frequency fP1 (91.25 MHz) of the channel 1 tuned by the channel selecting apparatus is assumed to be changed to an offset signal frequency fSIG. In this case, first of all, the microprocessor 41 will not be able to recognize the offset signal frequency, will therefore operate the frequency dividing ratio to receive the regular frequency fP2 of the channel 2 and will feed this operated frequency dividing ratio to the data latch 19 to have the regular frequency fP2 of the channel 2 received. Then, the microprocessor 41 will shift to the process by the step S50 as shown in FIG. 9 to tune with the optional signal frequency (in this case, the offset signal frequency fSIG). In this process, the frequency will be corrected to be tuned with the frequency made by adding the corrected frequency amount of the ±Δf part to the regular frequency fP2 of the channel 2. As a result, as shown in FIG. 10, the channel selecting apparatus will receive the offset signal frequency fSIG at the processing time t1.

Then, the microprocessor 41 will detect the signal frequency of the offset signal frequency fSIG by the process by the step S51 to distinguish whether the now received offset signal frequency fSIG is a video signal or sound signal and will judge whether there is a signal carrier or not in this detected signal frequency. That is to say, the microprocessor 41 will judge whether the detected signal frequency is or not a television signal of the so-called NTSC system which is in a specific frequency relation as shown in the frequency form of the video carrier and sound carrier. If it is judged by the process by the step S51 that there is a signal carrier, the process will shift to the step S52 but, if it is judged that there is no signal carrier, it will be judged that the now received frequency signal is not a television signal and, by the process by the step S53, the processing will be made to be tuned with the regular frequency fP2 of the channel 2 with which it was tuned before the process.

Therefore, in this embodiment, as shown in FIG. 10, at the processing time t1, the offset signal frequency fSIG will show a video carrier and will be therefore judged by the process by the step S51 to have a signal carrier and the next step will shift to the process by the step S52. By the process by the step S52, the frequency will be corrected to be tuned with the signal frequency fX made by adding 4.5 MHz to the offset signal frequency fSIG. That is to say, in this process, by tuning the frequency to be higher by 4.5 MHz than, for example, the offset signal frequency fSIG, it will be confirmed whether there is or not a signal carrier at this time. Thereby, as shown in FIG. 10, at the processing time t2, the channel selecting apparatus will receive a sound carrier frequency fSIGS higher by 4.5 MHz than the video signal carrier of the offset signal frequency fSIG.

At the processing time t2, the microprocessor 41 will be tuned with the sound carrier frequency fSIGS of the offset signal and the process will shift to the process by the step S54. In the process by the step S54, in such the same as the process by said step S51, the signal frequency of the sound carrier frequency fSIGS now being received will be detected, from this detected signal frequency, it will be judged whether there is a signal carrier or not. That is to say, when it is judged by this process that there is a signal carrier, the sound carrier frequency fSIGS of the now tuned offset signal will be judged to have a specific frequency relation showing the frequency form of the television signal, that is to say, the offset signal frequency fSIG tuned at the processing time t1 will be able to be confirmed to be positively the carrier frequency of the video signal. Therefore, in this case, as it is judged that there is a signal carrier, the frequency will be corrected to tune the signal frequency corrected from the regular frequency f0 by the step 55, that is, the offset signal frequency fSIG and, as a result, as shown in FIG. 10, at the processing time t3, the offset signal fSIG which is a video signal will be able to be positively received. By the way, in case it is judged by the process by the step S54 that there is no signal carrier, the now received signal frequency fX will be no video signal.

The case that, as shown in FIG. 11, from the regular frequency fP1 of the channel 1 tuned by the channel selecting apparatus, the signal frequency fSIG offset to be lower than the regular frequency fP2 of the channel 2 is to be tuned shall be explained in the following. By the way, the same as in the above, the regular frequency fP2 of the channel 2 shall be 97.25 MHz and the offset signal frequency fSIG shall be 94.25 MHz.

Now, the tuned regular frequency of the channel 1 is assumed to be converted to the offset signal frequency fSIG. In this case, first of all, as the microprocessor 31 can not recognize the offset signal frequency, the same as in the operation example shown in FIG. 10, the microprocessor 41 will feed to the data latch 19 the frequency dividing ratio for receiving the regular frequency fP2 of the channel 2 to receive the regular frequency fP2 of the channel 2. Then, the microprocessor 41 will shift to the process by the step S50 as shown in FIG. 9 to be tuned with the optional signal frequency (in this case, the offset signal frequency fSIG) and will correct the frequency the same as is mentioned above. However, in such operation by the microprocessor 41, the now received regular frequency fP2 of the channel 2 and the sound carrier frequency fSIGS of the offset signal frequency fSIG will approach each other and further the frequency will be corrected by continuously raising the received frequency in case the microprocessor 41 corrects the frequency. As a result, as shown in FIG. 11, at the processing time t1, the sound carrier frequency fSIGS of the offset signal will be received.

Therefore, in order to distinguish whether the sound carrier frequency fSIGS of the now received offset signal is a video signal or sound signal, by the process by the step S51, the microprocessor 41 will detect the signal frequency of this signal frequency fSIGS and it will be judged whether there is a signal carrier or not in this detected signal frequency.

Therefore, as there is a signal carrier in the sound carrier frequency fSIGS of the offset signal, the detected signal frequency will be judged by the process by the step S51 to be a television signal and the process will be shifted to the step S52. By the way, if it is judged on the contrary by this process that there is no signal carrier, the now received frequency signal will be judged to be no television signal and will be processed by the process by the step S53 to be tuned with the specific frequency fP2 of the channel 2 with which it had been tuned before it was processed.

Then, by the process by the step S52, the frequency will be corrected to be tuned with the signal frequency fX made by adding 4.5 MHz to the sound carrier frequency fSIGS. That is to say, as the sound carrier frequency fSIGS is 98.75 MHz, the signal frequency higher by 4.5 MHz than this will be 103.25 MHz. The regular frequency fP2 of the so called channel 3 will be received at the processing time t2 as shown in FIG. 11.

Then, the microprocessor 41 will shift the process to the step S54, will detect the signal frequency of the now received regular frequency fP3 (103.25 MHz) of the channel 3 and will process to judge whether there is a signal carrier or not. However, in this case, a CATV, television game or a modulated signal of a VTR will be received from the antenna 1 shown in FIG. 8 and therefore, in fact, there will be no signal of the regular frequency fP3 of the channel 3. Therefore, by the process by the step S54, it will be judged that there is no signal carrier.

Then, the microprocessor 41 will shift the process to the step S56 and will be tuned with the signal frequency fY lower by 4.5 MHz than the sound carrier frequency fSIGS of the offset signal corrected and tuned at the processing time t1 by the process by this step S56. As a result, at the processing time t3, the signal frequency fY will be tuned. Thereafter, by the process by the step S57, the now tuned signal frequency fY will be detected and it will be judged whether there is a signal carrier or not. In the process by the step S57, as the frequency lower by 4.5 MHz than the sound carrier frequency fSIGS tuned at the processing time t1 is the video carrier frequency fSIG of the offset signal as shown in FIG. 11, it will be judged that there is a signal carrier.

When it is judged by the process by the step S57 that there is a signal carrier, the microprocessor 41 will shift the process to the step S58. In the process by the step S57, as shown in FIG. 11, the microprocessor 41 will process the signal frequency fY tuned at the processing time t3 so as to be tuned continuously as it is and then will complete the tuning process. That is to say, by the processes by the steps S56 and S57, it will be judged that the signal frequency fY has the frequency form of the video and sound carriers which the television signal has and, further, the signal frequency higher by 4.5 MHz than the signal frequency fY will be judged to be the sound carrier frequency fSIGS. Therefore, the signal frequency fY will be judged by the microprocessor 41 to be the video carrier frequency fSIG of the offset signal and the channel selecting apparatus will be able to be positively tuned with the offset signal frequency fSIG which is a video signal. By the way, in case it is judged by the process by the step S57 that there is no signal carrier, the signal frequency fY will be no video carrier frequency. In this case, the frequency will be processed by the step S55 to be tuned with the signal frequency fS tuned at the processing time t2 in FIG. 11.

Therefore, according to this embodiment, in case the the signal frequency fSIG optionally offset from the regular frequency is to be received, by confirming whether there are respective signal carriers or not from the frequency relation of the video signal and sound signal by using the microprocessor, whether there is a signal or not will be able to be judged and the video signal and sound signal will be able to be distinguished from each other. Therefore, there are effects that tuning can be made positively without making unstable detection by a synchronous signal and an operation stable in the performance can be obtained.

According to the above described fourth embodiment, in case the broadcast signal not transmitted in the regular frequency is to be received, the broadcast signal will be tuned with an optionally set frequency and then the frequency will be corrected and thereby, even in case the frequency is offset to be lower than the regular frequency, the frequency pulling-in range will be able to be well secured. Therefore, the offset signal frequency can be positively tuned. Further, according to the fifth embodiment, the distinction of the video signal and sound signal can be positively judged by processing to detect and judge the signal frequency with the microprocessor without using a synchronous signal to distinguish the video signal and sound signal. Therefore, the channel selecting performance will improve and a favorable channel selecting operation will be able to be obtained.

By the way, the present invention is not limited to only the above described embodiments but can be variously modified and worked without deviating from the subject matter of the invention.

What is claimed is:

1. A channel selecting apparatus for receiving broadcast signals from different channels, where carriers of broadcast signals from a first channel represent standard carriers and where carriers of broadcast signals from a second channel represent offset carriers that are offset from standard values, comprising:

a heterodyne receiver including a voltage controlled oscillating circuit for producing a predetermined local oscillating signal, and for producing a heterodyne signal having an intermediate frequency produced by mixing said local oscillating signal with a selected broadcast signal from among said broadcast signals;

demodulating means for generating a base band signal by demodulating an output signal from said heterodyne receiver;

a PLL circuit including a phase comparator for generating a phase comparing result based on a difference in phase between a reference signal of a predetermined frequency and said local oscillating signal produced by said voltage controlled oscillating circuit, for producing a controlling voltage that varies based on said phase comparing result, and for controlling an oscillating frequency of said voltage controlled oscillating circuit based on said controlling voltage;

measuring means, connected to an output terminal of said heterodyne receiver, for measuring a frequency of said heterodyne signal and for generating frequency measured data representing said measurement; and a microprocessor for receiving said frequency measured data generated by said measuring means, and for producing a controlling signal for controlling said PLL circuit based on said frequency measured data, wherein said controlling signal represents data corresponding to a frequency difference between the heterodyne signal currently produced by said heterodyne receiver and a heterodyne signal corresponding to a standard carrier when said selected broadcast signal currently selected represents an offset carrier, said oscillating frequency of said oscillating circuit being varied based on said frequency difference.

2. A channel selecting apparatus for receiving broadcast signals from different channels, where carriers of broadcast signals from a first channel represent standard carriers and where carriers of broadcast signals from a second channel represent offset carriers that are offset from standard values, comprising:

a heterodyne receiver including a first voltage controlled oscillating circuit for producing a predetermined local oscillating signal, where a heterodyne signal of an intermediate frequency is produced by mixing said local oscillating signal a selected broadcast signal from among said broadcast signals;

demodulating means for generating a base band signal by demodulating an output signal from said heterodyne receiver;

a first PLL circuit including a phase comparator for generating a phase comparing result based on a difference in phase between a reference signal having a predetermined frequency and said predetermined local oscillation signal produced by said first voltage controlled oscillating circuit, for producing a controlling voltage that varies based on said phase comparing result, and for controlling an oscillating frequency of said first oscillating circuit based on said controlling voltage;

a second PLL circuit connected to the output terminal of the heterodyne receiver, said second PLL circuit including a second oscillating circuit having an oscillating frequency that varies in accordance with said frequency of said heterodyne signal so that the frequency of the heterodyne signal and the oscillating frequency of said second oscillating circuit have the same phase;

measuring means, connected to an output of said second PLL circuit, for measuring a frequency of an output signal produced by said second PLL circuit in real time, and for generating frequency measured data representing said frequency measurements; and a microprocessor for receiving frequency measured data generated by said measuring means and for producing a controlling signal based on said frequency measured data for controlling said first PLL circuit, wherein said controlling signal represents data corresponding to a frequency difference between the heterodyne signal currently produced by said heterodyne receiver and a heterodyne signal corresponding to a standard carrier when a currently selected broadcast signal represents an offset carrier, said oscillating frequency of said first oscillating circuit being varied based on said frequency difference, wherein the second PLL circuit feeds a locked oscillating signal as a synchronized demodulating reference signal to said demodulating circuit means for demodulating said output signal from said heterodyne receiver.

3. A channel selecting apparatus comprising:

a heterodyne receiver for receiving both components of a broadcast signal, for mixing said components to receive a broadcast and a signal of a first voltage controlled oscillating circuit, for producing a predetermined local oscillating signal, and for generating a heterodyne signal;

a demodulating circuit for demodulating the output signal generated by the heterodyne receiver, and for producing an output as a base band signal;

a first PLL circuit including a phase comparator for generating a phase comparing result based on a difference in phase between a reference signal having a predetermined frequency and said predetermined local oscillation signal produced by said first voltage controlled oscillating circuit, for producing a controlling voltage that varies based on said phase comparing result, and for controlling an oscillating frequency of said first oscillating circuit based on said controlling voltage;

a second PLL circuit including a second oscillating circuit having an oscillating frequency that varies such that the frequency of the heterodyne signal and the oscillating frequency by said second oscillating circuit have the same phase;

a measuring circuit, connected to an output of said second PLL circuit, for measuring a frequency of an output signal produced by said second PLL circuit, and for generating frequency measured data based on said frequency measurements; and a microprocessor for receiving the frequency measured data from the measuring circuit, for setting a frequency for receiving a optional broadcast signal, for controlling the first PLL circuit to vary the oscillated frequency of the oscillating circuit based on a set frequency, for receiving the optional broadcast signal, for detecting the frequency difference between the frequency measured data from the measuring circuit when the broadcast signal is received and the regular frequency, and for controlling the first PLL circuit to vary the oscillated frequency of the first oscillating circuit based on the frequency difference detected.

4. A channel selecting apparatus according to claim 3 wherein a signal frequency offset to be higher or lower than the regular frequency of the broadcast signal is to be received, the microprocessor will not limit the tuned frequency of the channel to be selected to the regular frequency of this channel but will tune it with the set frequency, will detect the frequency difference between this set frequency and the regular frequency and will control and correct the first PLL circuit to vary the oscillated frequency of the first oscillating circuit on the basis of this detected result.

5. A channel selecting apparatus according to claim 4 wherein the set frequency is an optional frequency in the output band of the heterodyne receiver and is set by subtracting the difference between the regular video carrier frequency of the channel in the broadcast signal and the frequency in the intermediate range of the signal band from the regular video carrier frequency of the channel.

6. A channel selected apparatus characterized by comprising:

a heterodyne receiver including a voltage controlled by oscillating circuit for producing a predetermined local oscillating signal, and for producing a heterodyne signal having an intermediate frequency produced by mixing said local oscillating signal with a selected broadcast signal from among said broadcast signals;

demodulating means for generating a base band signal by demodulating an output signal from said heterodyne receiver;

a first PLL circuit including a phase comparator for generating a phase comparing result based on a difference in phase between a reference signal having a predetermined frequency and said predetermined local oscillation signal produced by said first voltage controlled oscillating circuit, for producing a controlling voltage that varies based on said phase comparing result, and for controlling an oscillating frequency of said first oscillating circuit based on said controlling voltage;

a second PLL circuit including a second oscillating circuit having an oscillating frequency that varies such that the frequency of the heterodyne signal and the oscillating frequency by said second oscillating circuit have the same phase;

a measuring circuit, connected to an output of said second PLL circuit, for measuring a frequency of an output signal produced by said second PLL circuit, and for generating frequency measured data based on said frequency measurements; and a microprocessor for determining the presence of a signal carrier based on the frequency measured data when any optional broadcast signal is received, and for determining the presence of a signal carrier based on the frequency measured data when another broadcast signal is received, and for receiving a specific broadcast signal by controlling the first PLL circuit to vary the oscillated frequency of the first oscillating circuit based on whether a signal carrier is determined to be present.

7. A channel selecting apparatus according to claim 6 characterized in that the microprocessor confirms that the specific broadcast signal is a video carrier frequency, controls the first PLL circuit to receive this confirmed video carrier frequency and tunes the video carrier frequency.

* * * * *